(12) United States Patent
Kwag

(10) Patent No.: US 11,043,518 B2
(45) Date of Patent: Jun. 22, 2021

(54) IMAGE SENSOR INCLUDING A PIXEL BLOCK HAVING 8-SHARED PIXEL STRUCTURE

(71) Applicant: SK hynix Inc., Gyeonggi-do (KR)

(72) Inventor: Pyong-Su Kwag, Chungcheongbuk-do (KR)

(73) Assignee: SK hynix Inc., Icheon-si (KR)

(*) Notice: Subject to any disclaimer, the term of this patent is extended or adjusted under 35 U.S.C. 154(b) by 261 days.

(21) Appl. No.: 16/218,227

(22) Filed: Dec. 12, 2018

(65) Prior Publication Data

US 2019/0237496 A1   Aug. 1, 2019

(30) Foreign Application Priority Data

Jan. 29, 2018   (KR) .......... 10-2018-0010809

(51) Int. Cl.
*H01L 27/146* (2006.01)
*H04N 5/3745* (2011.01)

(52) U.S. Cl.
CPC .. *H01L 27/14605* (2013.01); *H01L 27/14603* (2013.01); *H01L 27/14614* (2013.01); *H01L 27/14641* (2013.01); *H01L 27/14643* (2013.01); *H04N 5/3745* (2013.01)

(58) Field of Classification Search
CPC ......... H01L 27/14641; H01L 27/14605; H01L 27/14603; H01L 27/14614
See application file for complete search history.

(56) References Cited

U.S. PATENT DOCUMENTS

2013/0049082 A1* 2/2013 Kato ................ H01L 27/14612
257/292
2017/0236858 A1 8/2017 Oh et al.

\* cited by examiner

*Primary Examiner* — Errol V Fernandes
(74) *Attorney, Agent, or Firm* — Perkins Coie LLP

(57) ABSTRACT

An image sensor includes a first pixel group and a second pixel group positioned adjacent to the first pixel group. The first pixel group includes a first light receiving circuit and first and second driving circuits formed adjacent to one end of the first light receiving circuit. The first light receiving circuit includes a plurality of unit pixels sharing a first floating diffusion. The second pixel group includes a second light receiving circuit and third and fourth driving circuits formed adjacent to one end of the second light receiving circuit. The second light receiving circuit includes a plurality of unit pixels sharing a second floating diffusion. The first driving circuit is coupled in parallel to the third driving circuit, and the second driving circuit is coupled in parallel to the fourth driving circuit.

30 Claims, 16 Drawing Sheets

IMAGE SENSOR INCLUDING A PIXEL BLOCK HAVING 8-SHARED PIXEL STRUCTURE

CROSS-REFERENCE TO RELATED APPLICATION

This patent document claims the priority and benefits of Korean Patent Application No. 10-2018-0010809 filed on Jan. 29, 2018, which is incorporated herein by reference in its entirety.

TECHNICAL FIELD

The technology and implementations disclosed in this patent document relate to image sensors.

BACKGROUND

An image sensor is a device that captures optical images and converts the optical images into electrical signals. With the growing consumer demand for such electronic devices as digital cameras, camcorders, personal communication systems (PCS), game consoles, security cameras, medical micro-cameras and robots, many semiconductor manufacturers are directing their efforts towards the development of highly-integrated, high-performance image sensors.

SUMMARY

This patent document provides, among others, designs of highly-integrated, high-performance image sensors.

In an embodiment of the disclosed technology, an image sensor may include: a first pixel group including (1) a first light receiving circuit that includes a plurality of unit pixels sharing a first floating diffusion and responsive to incident light to produce photocharges and (2) first and second driving circuits formed adjacent to one end of the first light receiving circuit to generate a first output signal representing the photocharges produced by the first light receiving circuit; and a second pixel group arranged adjacent to the first pixel group and including (1) a second light receiving circuit that includes a plurality of unit pixels sharing a second floating diffusion and responsive to incident light to produce photocharges and (2) third and fourth driving circuits formed adjacent to one end of the second light receiving circuit to generate a second output signal representing the photocharges produced by the second light receiving circuit. The first driving circuit may be electrically coupled in parallel with respect to the third driving circuit, and the second driving circuit may be electrically coupled in parallel with respect to the fourth driving circuit.

In an embodiment of the disclosed technology, an image sensor may include: at least two light receiving circuits each including a plurality of unit pixels converting light into electrical signals, the plurality of unit pixels of the at least two light receiving circuits sharing a floating diffusion; a first driving circuit coupling a first power node to floating diffusions, and configured to initialize the floating diffusions in response to a reset signal; a second driving circuit coupling a second power node to a third driving circuit, and configured to generate an output signal corresponding to an amount of photocharges generated in the light receiving circuits in response to incident light, the second driving circuit comprising a plurality of transistors coupled in parallel; and a third driving circuit coupling the second driving circuit to an output line, and configured to output, to the output line, the output signal generated in the second driving circuit in response to a select signal. The first driving circuit or the third driving circuit may include a plurality of transistors coupled in parallel, or each of the first driving circuit and the third driving circuit comprises a plurality of transistors coupled in parallel.

In an embodiment of the disclosed technology, an image sensor may include: a first pixel group and a second pixel group which is positioned adjacent to the first pixel group, wherein the first pixel group may include a first light receiving circuit which includes a plurality of unit pixels sharing a first floating diffusion and a first driving circuit and a second driving circuit which are formed adjacent to one end of the first light receiving circuit, wherein the second pixel group may include a second light receiving circuit which includes a plurality of unit pixels sharing a second floating diffusion and a third driving circuit and a fourth driving circuit which are formed adjacent to one end of the second light receiving circuit, and wherein the first driving circuit may be coupled in parallel with the third driving circuit, and the second driving circuit may be coupled in parallel with the fourth driving circuit.

In an embodiment of the disclosed technology, an image sensor may include: at least two light receiving circuits each including a plurality of unit pixels which share a floating diffusion; a first driving circuit coupling a first power node and floating diffusions, and configured to initialize the floating diffusions in response to a reset signal; a second driving circuit coupling a second power node and a third driving circuit, configured to generate an output signal corresponding to an amount of photocharges generated in the light receiving circuits in response to incident light, and including a plurality of transistors which have a parallel coupling stricture; and a third driving circuit coupling the second driving circuit and an output line, and configured to output the output signal generated in the second driving circuit, to the output line, in response to a select signal, wherein the first driving circuit or the third driving circuit may include a plurality of transistors which have a parallel coupling structure, or each of the first driving circuit and the third driving circuit may include a plurality of transistors which have a parallel coupling structure.

DETAILED DESCRIPTION

The disclosed image sensing technology can be implemented to achieve high-quality, high-resolution imaging while minimizing the size of an image sensor. In order to provide a high-resolution image, the image sensor some embodiments of the disclosed technology may have a shared pixel structure. However, while the shared pixel structure is easy to increase a fill factor representing the ratio of pixel's light sensitive or sensing area to its total area, or the ratio of the photo sensing element or circuit area (e.g., a photodiode area) to the total pixel area, operation characteristics may deteriorate as the area of a driving circuit including pixel transistors decreases. Accordingly, while the shared pixel structure may increase the light receiving area of a photoelectric conversion element, the performances of the pixel transistors such as driver transistor (DX), reset transistor (RX), and select transistor (ST) degrade because areas in which the pixel transistors are formed are reduced relatively. Moreover, process deviations in manufacturing of the shared pixel structure may cause the pixels to have uneven characteristics and to be vulnerable to temporal noise.

In the shared pixel structure, differences in the types and shapes of structures adjacent to respective unit pixels sharing a floating diffusion, for example, conductive lines and the pixel transistors, may also cause unit pixels to have uneven characteristics due to the overlap capacitance or parasitic capacitance induced among them. For example, the overlap capacitance or parasitic capacitance may cause variations in pixel signals output from the pixel even under the same condition.

The disclosed technology provides image sensor techniques that can be used to resolve the issues discussed above and to provide an image sensor that has a shared pixel structure to provide a high-quality, high-resolution image and at the same time is capable of maximizing the sizes of the pixel transistors within a limited area.

In this patent document, a first direction D1 may be a horizontal direction or a row direction, and a second direction D2 may be a vertical direction or a column direction. While it is illustrated in some embodiments of the disclosed technology that the first direction D1 and the second direction D2 are a row direction and a column direction, respectively, it is to be noted that the disclosed technology is not limited thereto. That is to say, the first direction D1 may be a column direction, and the second direction D2 may be a row direction.

Figure 1:
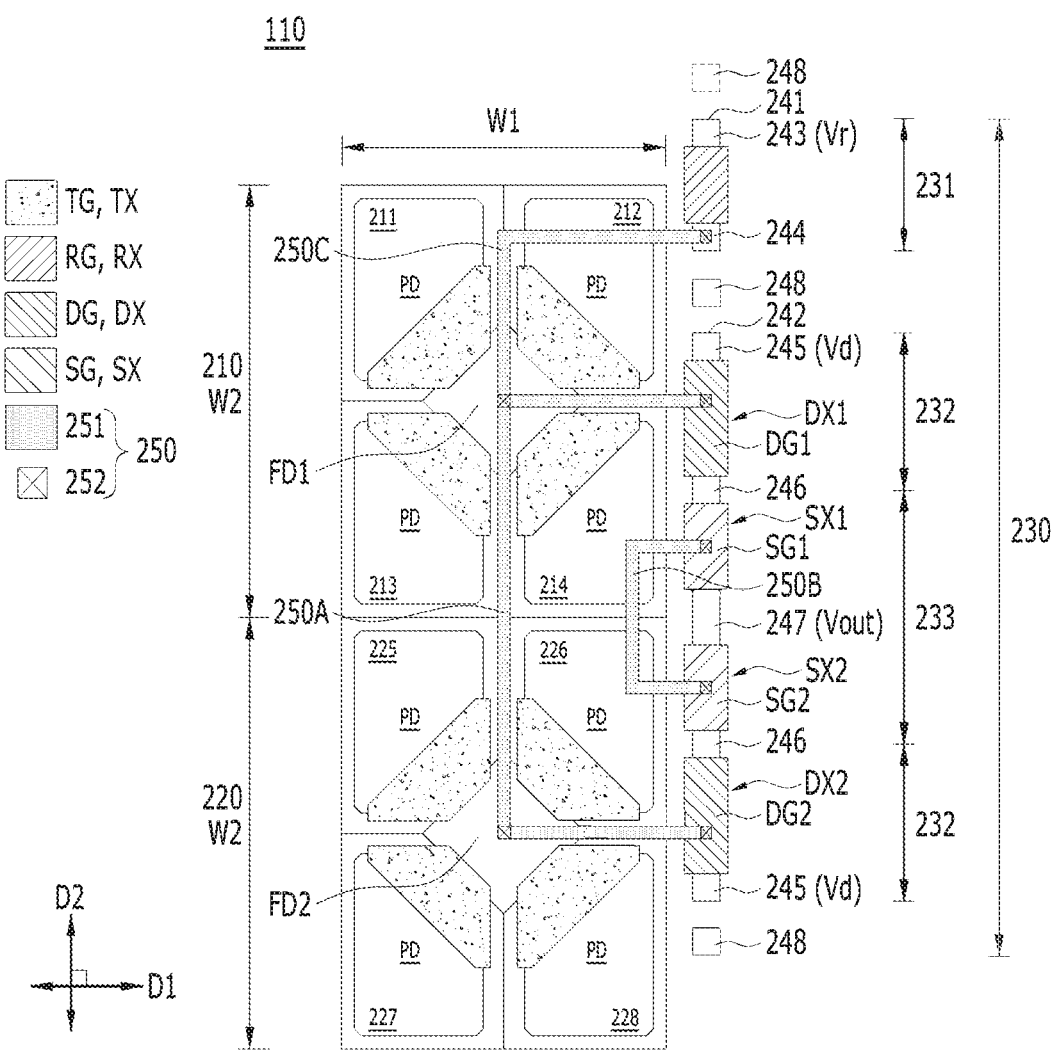
FIG. 1 is a layout illustrating an example of a pixel block of an image sensor based on an embodiment of the disclosed technology.
Figure 2:
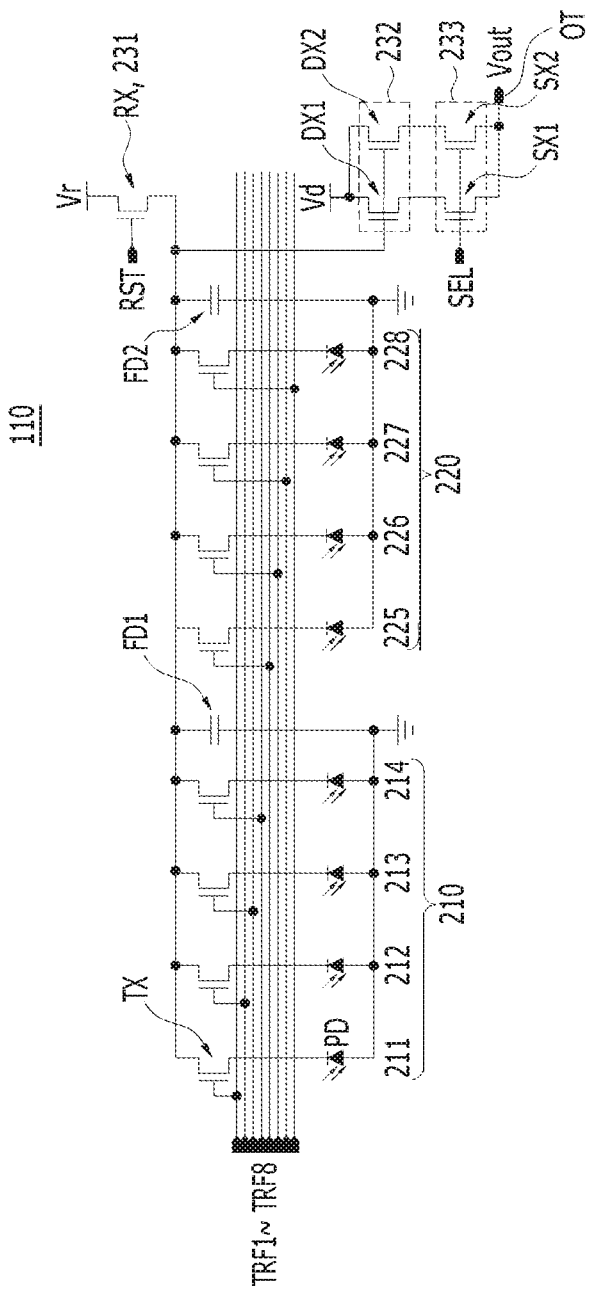
FIG. 2 is an equivalent circuit diagram corresponding to pixel blocks of image sensors based on some embodiments of the disclosed technology.
Figure 3:
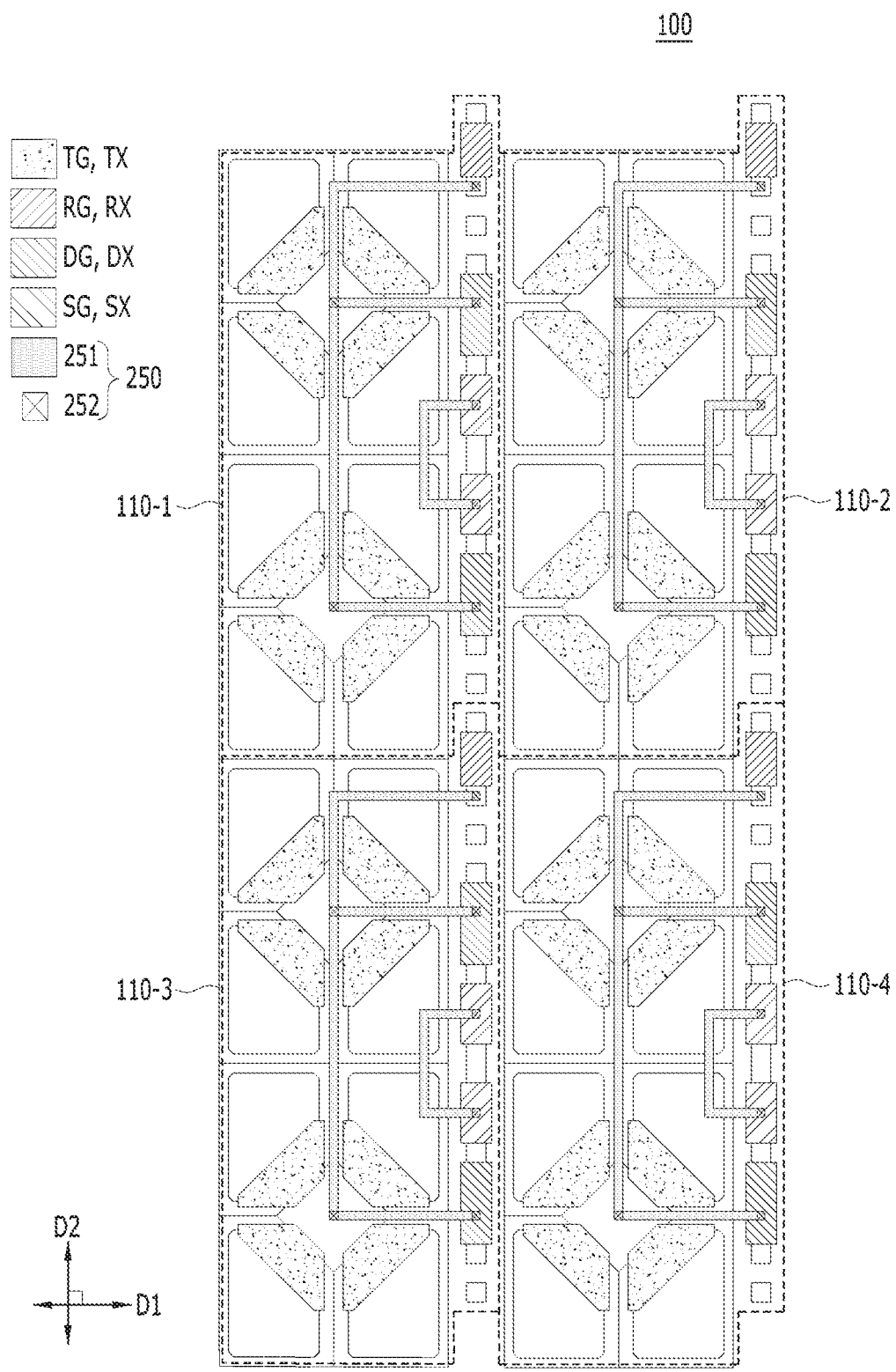
FIG. 3 is a layout illustrating an example of a portion of a pixel array of the image sensor illustrated in FIG. 1.

FIG. 1 is a layout illustrating an example of a pixel block of an image sensor based on an embodiment of the disclosed technology. FIG. 2 is an equivalent circuit diagram corresponding to pixel blocks of image sensors based on some embodiments of the disclosed technology. FIG. 3 is a layout illustrating an example of a portion of a pixel array of the image sensor illustrated in FIG. 1.

As shown in FIGS. 1 to 3, the image sensor implemented based on an embodiment of the disclosed technology may include a pixel array 100 in which a plurality of pixel blocks 110 (e.g., 110-1, 110-2, 110-3, 110-4 as shown in FIG. 3) are arranged. In the pixel array 100, the plurality of pixel blocks 110 may be arranged in a matrix structure (see FIG. 3) or a zigzag structure.

Each of the plurality of pixel blocks 110 may have a shared pixel structure. For example, each of the plurality of pixel blocks 110 may have an 8-shared pixel structure, which facilitates the enlargement of the pixel transistor size compared to a 4-shared pixel structure. Each of the plurality of pixel blocks 110 may include a first light receiving circuit 210, which includes a plurality of unit pixels sharing a first floating diffusion FD1, a second light receiving circuit 220, which includes a plurality of unit pixels sharing a second floating diffusion FD2, a driving circuit 230, which includes a reset transistor RX, a driver transistor DX and a selection transistor SX, and an intercoupling circuit 250, which electrically couples the first light receiving circuit 210, the second light receiving circuit 220 and the driving circuit 230 to each other. For reference, the reset transistor RX, the driver transistor DX and the selection transistor SX may be referred to as pixel transistors.

In each of the plurality of pixel blocks 110, the first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels (e.g., a first unit pixel 211 to a fourth unit pixel 214), which share the first floating diffusion FD1 and are arranged in a 2×2 matrix structure. The second light receiving circuit 220 may include four unit pixels (e.g., a fifth unit pixel 225 to an eighth unit pixel 228), which share the second floating diffusion FD2 and are arranged in a 2×2 matrix structure. The first light receiving circuit 210 and the second light receiving circuit 220 may be positioned adjacent to each other, and may be aligned in the second direction D2. Therefore, the first floating diffusion FD1 and the second floating diffusion FD2 may also be aligned in the second direction D2. In other words, the first floating diffusion FD1 and the second floating diffusion FD2 may be positioned on the same line in the second direction D2. The first floating diffusion FD1 and the second floating diffusion FD2 may be electrically coupled to each other through the intercoupling circuit 250.

In each of the plurality of pixel blocks 110, the first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width extending in the row direction, and the second pitch W2 may be a width extending in the column direction. The first pitch W1 and the second pitch W2 may have the same length (W1=W2) or the second pitch W2 may be larger than the first pitch W1 due to the disposition of the driving circuit 230 in the pixel block 110 (W2>W1). It is illustrated in FIGS. 1 to 3 that the second pitch W2 is larger than the first pitch W1 for example.

In each of the plurality of pixel blocks 110, each of the first unit pixel 211 to the eighth unit pixel 228 may include a photoelectric conversion element PD which generates photocharges in response to incident light and a transfer transistor TX which transfers the photocharges generated in the photoelectric conversion element PD, to the floating diffusion FD in response to a transfer signal TRF. The floating diffusion FD may temporarily store the photocharges transferred through the transfer transistor TX from the photoelectric conversion element PD. The photoelectric conversion element PD may include a photodiode, a phototransistor, a photogate, a pinned photodiode (PPD) or a combination thereof. In an embodiment of the disclosed technology, the photoelectric conversion element PD may include organic or/and inorganic photodiodes. For example, the photoelectric conversion element PD may include either organic and inorganic photodiodes, or may be formed by stacking an organic photodiode and an inorganic photodiode on top of one another. The transfer signal TRF may be generated in a row driver (see the reference numeral 150 of FIG. 15), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110, the driving circuit 230 may include a first driving circuit 231, second driving circuits 232 and a third driving circuit 233. The driving circuit 230 may further include pickup regions 248 which are disposed adjacent to the second driving circuit 232. The first driving circuit 231 may initialize the first floating diffusion FD1, the second floating diffusion FD2 and the photoelectric conversion elements PD in response to a reset signal RST. Each second driving circuit 232 may generate an output signal corresponding to the photocharges generated in each of the light receiving circuits 210 and 220 in response to incident light. The third driving circuit 233 is coupled to the second driving circuits 232 to receive their output signals to generate the output signal Vout, which is generated in the second driving circuit 232, in response to a select signal SEL. The driving circuit 230 may be positioned at one side of the light receiving circuits 210 and 220, for example, the right side of the light receiving circuits 210 and 220, in the first direction D1. The first driving circuit 231 to the third driving circuit 233 may be aligned in the second direction D2, and may have a shape that, at a portion thereof, projects out of the light receiving circuits 210 and 220 in the second direction D2. This helps prevent characteristic degradation that may be caused by the presence of the intercoupling circuit 250 which electrically couples the light receiving circuits 210 and 220 to the driving circuit 230. For example, the portion of the driving circuit 230 that projects out of the light receiving circuits 210 and 220 allows the intercoupling circuit 250 to have a symmetrical shape, and this helps prevent unwanted variations in the operation characteristics of the plurality of unit pixels.

In each of the plurality of pixel blocks 110, the first driving circuit 231 may initialize the first floating diffusion FD1, the second floating diffusion FD2, and the photoelectric conversion elements PD in response to the reset signal RST. To this end, the first driving circuit 231 may include at least one reset transistor RX. In FIG. 2, as an example, it is illustrated that the first driving circuit 231 includes one reset transistor RX. The reset signal RST may be generated in the row driver (see the reference numeral 150 of FIG. 15), and may be applied to the reset transistor RX through a row line (not shown) which extends from the row driver and is coupled to a reset gate RG.

In each of the plurality of pixel blocks 110, the first driving circuit 231 may include a first active region 241, the reset gate RG, which is formed on the first active region 241, and a first junction region 243 and a second junction region 244, which are formed in the first active region 241 at both ends of the reset gate RG. The first active region 241 may have a bar shape that has a major axis extending in the second direction D2 and a minor axis extends in the first direction D1. The reset signal RST may be applied to the reset gate RG. The first junction region 243 may be the drain of the reset transistor RX. The reset transistor RX may be supplied with a reset voltage Vr through the first junction region 243. The reset voltage Vr may be a positive voltage. For example, the reset voltage Vr may be a power supply voltage (VDD) or a positive voltage larger than the power supply voltage (VDD). The second junction region 244 may be the source of the reset transistor RX. The second junction region 244 may be electrically coupled to the intercoupling circuit 250, and may be electrically coupled to the first floating diffusion FD1 and the second floating diffusion FD2 through the intercoupling circuit 250.

In each of the plurality of pixel blocks 110, the first driving circuit 231 may be positioned adjacent to the first light receiving circuit 210, and may have a shape that, at a portion of the first driving circuit 231, projects out of the light receiving circuits 210 and 220 in the second direction D2. The first driving circuit 231 may be positioned adjacent to the second unit pixel 212 of the first light receiving circuit 210. A portion of the reset gate RG and the drain of the reset transistor RX, which is supplied with the reset voltage Vr, may be positioned outside the light receiving circuits 210 and 220. The above-described shape of the first driving circuit 231 makes it easy to provide a space for the second driving circuit 232 and the third driving circuit 233 to be formed and at the same time provide the intercoupling circuit 250 which has a symmetrical shape. Further, as the drain of the reset transistor RX, which is supplied with the reset voltage Vr, is positioned outside the light receiving circuits 210 and 220, a difficulty in designing a power line for supplying the reset voltage Vr may decrease. Moreover, disposing the entire driving circuit 230 at one side of the light receiving circuits 210 and 220 may enhance flexibility in designing the layout of the plurality of pixel blocks 110 in the pixel array 100, and may help highly integrating a shared pixel structure (see FIG. 4).

In each of the plurality of pixel blocks 110, the second driving circuit 232 may generate the output signal Vout corresponding to the photocharges generated in the light receiving circuits 210 and 220 in response to incident light. To this end, the second driving circuit 232 may include at least one driver transistor DX. For example, the second driving circuit 232 may include a plurality of driver transistors DX which have a parallel coupling structure. In FIG. 2, it is illustrated that the second driving circuit 232 includes a first driver transistor DX1 and a second driver transistor DX2 coupled in parallel, and this layout helps increase the channel areas compared to a case where the second driving circuit 232 has only one driver transistor DX. In particular, the layout including the first driver transistor DX1 and the second driver transistor DX2 coupled in parallel helps increase the effective channel widths of the driver transistors DX within a limited area. In this way, it is possible to improve the current driving force of the second driving circuit 232 and at the same time improve resistance to noise.

In each of the plurality of pixel blocks 110, the second driving circuit 232 may include a second active region 242 and first and second driver gates DG1 and DG2, which are formed on the second active region 242. The first driver gate DG1 and the second driver gate DG2 may be electrically coupled to the first floating diffusion FD1 and the second floating diffusion FD2 through the intercoupling circuit 250. The second active region 242 may have a bar shape that has a major axis extending in the second direction D2 and a minor axis extending in the first direction D1. The major axis of the second active region 242 and the major axis of the first active region 241 may be aligned in the second direction D2. Third junction regions 245 may be formed in the second active region 242 at one end of the first driver gate DG1 and at the other end of the second driver gate DG2. The third junction regions 245 may be the drains of the first driver transistor DX1 and the second driver transistor DX2. The first driver transistor DX1 and the second driver transistor DX2 may be supplied with a driver voltage Vd through the third junction regions 245. The driver voltage Vd may be a positive voltage. For example, the driver voltage Vd may be the power supply voltage (VDD) or a positive voltage larger than the power supply voltage (VDD). Fourth junction regions 246 may be formed in the second active region 242 at the other end of the first driver gate DG1 and at one end of the second driver gate DG2. The fourth junction regions 246 may be the sources of the first driver transistor DX1 and the second driver transistor DX2.

In each of the plurality of pixel blocks 110, the first driver transistor DX1 of the second driving circuit 232 may be positioned adjacent to the first light receiving circuit 210, and the second driver transistor DX2 may be positioned adjacent to the second light receiving circuit 220. The first driver transistor DX1 and the second driver transistor DX2 may be symmetrical to each other with respect to the boundary where the first light receiving circuit 210 and the second light receiving circuit 220 adjoin each other. In this way, it is possible to prevent the operation characteristics of the plurality of unit pixels from becoming different. Furthermore, since the intercoupling circuit 250 which has a symmetrical shape may be provided, it is possible to effectively prevent unwanted variations in the operation characteristics of the plurality of unit pixels.

In each of the plurality of pixel blocks 110, the pickup regions 248 provide reference potential for the pixel block 110. In particular, the pickup regions 248 provide reference potential for the driving circuit 230 in the pixel block 110. For example, a ground voltage (VSS) may be supplied to the pixel block 110 through the pickup regions 248. As the reference potential, for example, the ground voltage (VSS) is provided to the pixel block 110 through the pickup regions 248 to improve the operational stability of the pixel block 110. In order to effectively improve the operational stability of the pixel block 110, the pickup regions 248 may be positioned adjacent to the second driving circuit 232. For example, the pickup regions 248 may be positioned adjacent to the drain of the first driver transistor DX1 and the drain of the second driver transistor DX2. In other words, the pickup regions 248 may be formed to be adjacent to the third junction regions 245 which are supplied with the driver voltage Vd. As the pickup regions 248 are disposed adjacent to the third junction regions 245 to which the power supply voltage (VDD) or a positive voltage larger than the power supply voltage (VDD) is applied, it is possible to prevent a variation in the driver voltage Vd supplied to the third junction regions 245. In this way, it is possible to prevent a variation in the output signal Vout generated in the second driving circuit 232, and the operational stability of the pixel block 110 may be improved. The variation of the driver voltage Vd may occur due to various causes, and may mean that the magnitude or potential of the driver voltage Vd changes. Because the second driving circuit 232 generates the output signal Vout by adjusting the magnitude of the driver voltage Vd to reflect the amount of the photocharges generated in the light receiving circuits 210 and 220, if a variation occurs in the driver voltage Vd, a variation may occur in the output signal Vout as well.

The pickup region 248 of a second pixel block 110-3, which is adjacent in the second direction D2 to any one pixel block 110 (e.g., a first pixel block 110-1), among the plurality of pixel blocks 110-1, 110-2, 110-3, 110-4, may be disposed to be adjacent to the drain (e.g., the first junction region 243) of the reset transistor RX which is supplied with the reset voltage Vr, in the first pixel block 110-1 (see FIG. 3). In this way, the operational stability of the pixel block 110 may be further improved.

In each of the plurality of pixel blocks 110, the third driving circuit 233 may output the output signal Vout, which is generated in the second driving circuit 232, in response to the select signal SEL. To this end, the third driving section 233 may include at least one selection transistor SX, which is coupled in series to the second driving circuit 232. For example, the third driving circuit 233 may include a plurality of selection transistors SX, which have a parallel coupling structure. In FIG. 2, it is illustrated that the third driving circuit 233 includes a first selection transistor SX1 and a second selection transistor SX2 coupled in parallel. The first selection transistor SX1 and the second selection transistor SX2 may synchronize with each other in response to the select signal SEL, and may share one output terminal OT. Therefore, this layout helps increase the channel areas compared to a case where the third driving circuit 233 includes only one selection transistor SX. In particular, the layout including the first selection transistor SX1 and the second selection transistor SX2 coupled in parallel helps increase the effective channel widths of the selection transistors SX within a limited area. In this way, it is possible to improve the current driving force of the third driving circuit 233 and at the same time improve resistance to noise. In an example embodiment of the disclosed technology, the select signal SEL may be generated in the row driver (see the reference numeral 150 of FIG. 15), and may be applied to the selection transistors SX through row lines (not shown) extending from the row driver and coupled to selection gates SG.

In each of the plurality of pixel blocks 110, the third driving circuit 233 may be positioned between the first driver transistor DX1 and the second driver transistor DX2. The first selection transistor SX1 may be coupled in series to the first driver transistor DX1, and the second selection transistor SX2 may be coupled in series to the second driver transistor DX2. The first selection transistor SX1 and the first driver transistor DX1, which are coupled in series, and the second selection transistor SX2 and the second driver transistor DX2, which are coupled in series, may share the second active region 242. In this way, it is possible to easily increase the sizes of the pixel transistors within a limited area. The first selection transistor SX1 and the second selection transistor SX2 may include a first selection gate SG1 and a second selection gate SG2 which are formed on the second active region 242. The first selection gate SG1 and the second selection gate SG2 may be electrically coupled to each other through the intercoupling circuit 250. The fourth junction regions 246 may be formed in the second active region 242 between the first selection gate SG1 and the first driver gate DG1 and between the second selection gate SG2 and the second driver gate DG2. The fourth junction regions 246 may be the drains of the first selection transistor SX1 and the second selection transistor SX2, and may be electrically coupled to the source of the first driver transistor DX1 and the source of the second driver transistor DX2. A fifth junction region 247 may be formed in the second active region 242 between the first selection gate SG1 and the second selection gate SG2. The fifth junction region 247 may be the source of the first selection transistor SX1 and the second selection transistor SX2, and the first selection transistor SX1 and the second selection transistor SX2 may share the source. Therefore, the third driving circuit 233 may have one output terminal OT, and the fifth junction region 247 may be the output terminal OT of the third driving circuit 233. The fifth junction region 247 may be coupled to a column line (not shown), and the output signal Vout may be transferred to the column line through the fifth junction region 247.

In each of the plurality of pixel blocks 110, the first selection transistor SX1 of the third driving circuit 233 may be positioned adjacent to the first light receiving circuit 210, and the second selection transistor SX2 may be positioned adjacent to the second light receiving circuit 220. The first selection transistor SX1 and the second selection transistor SX2 may be symmetrical to each other with respect to the boundary where the first light receiving circuit 210 and the second light receiving circuit 220 adjoin each other. The boundary where the first light receiving circuit 210 and the second light receiving circuit 220 adjoin each other and the source of the first selection transistor SX1 and the second selection transistor SX2 (e.g., the fifth junction region 247) may be aligned in the first direction D1. In this way, it is possible to prevent the operation characteristics of the plurality of unit pixels from becoming different. Furthermore, since the intercoupling circuit 250 which has a symmetrical shape may be provided, it is possible to effectively prevent unwanted variations in the operation characteristics of the plurality of unit pixels.

In each of the plurality of pixel blocks 110, the intercoupling circuit 250 may include a first intercoupling circuit 250A to a third intercoupling circuit 250C. The first intercoupling circuit 250A may electrically couple the first floating diffusion FD1, the second floating diffusion FD2, the first driver gate DG1 and the second driver gate DG2. The first intercoupling circuit 250A may be symmetrical with respect to the boundary where the first light receiving circuit 210 and the second light receiving circuit 220 adjoin each other. The second intercoupling circuit 250B may electrically couple the first selection gate SG1 to the second selection gate SG2. Through the second intercoupling circuit 250B, the first selection transistor SX1 and the second selection transistor SX2 may synchronize with each other in response to the select signal SEL. The second intercoupling circuit 250B may be electrically decoupled from the first intercoupling circuit 250A and the third intercoupling circuit 250C, and may be symmetrical with respect to the boundary where the first light receiving circuit 210 and the second light receiving circuit 220 adjoin each other. The third intercoupling circuit 250C may electrically couple the first floating diffusion FD1 and the second floating diffusion FD2 to the first driving circuit 231, that is, the source of the reset transistor RX. To these ends, the first intercoupling circuit 250A to the third intercoupling circuit 250C may include conductive lines 251 and contacts 252, which couple the conductive lines 251 to the first floating diffusion FD1, the second floating diffusion FD2, the source of the reset transistor RX, the first driver gate DG1, the second driver gate DG2, the first selection gate SG1, and the second selection gate SG2. The first intercoupling circuit 250A and the second intercoupling circuit 250B are symmetrical with respect to the boundary where the first light receiving circuit 210 and the second light receiving circuit 220 adjoin each other to maintain parasitic capacitances existing between the intercoupling circuit 250 and the plurality of unit pixels (e.g., the first unit pixel 211 to the eighth unit pixel 228) at a constant value, thereby allowing each of the plurality of unit pixels to have uniform characteristics. Therefore, it is possible to prevent the output signals Vout outputted from the plurality of unit pixels under the same condition from varying.

As described above, in the image sensor illustrated in FIGS. 1 to 3, the layout including the second driving circuit 232 configured by the plurality of driver transistors DX coupled in parallel helps increase the sizes of the driver transistors DX (e.g., the channel areas of the driver transistors DX) within a limited area. Further, the second driving circuit 232 having the parallel coupling structure may help increase the effective channel widths of the driver transistors DX, and thus current driving force and resistance to noise may be improved.

Further, in the image sensor discussed above, the layout including the third driving circuit 233 configured by the plurality of selection transistors SX coupled in parallel helps increase the sizes of the selection transistors SX (e.g., the channel areas of the selection transistors SX) within a limited area. Further, the third driving circuit 233 having the parallel coupling structure may help increase the effective channel widths of the selection transistors SX, and thus current driving force and resistance to noise may be improved.

Also, since the second driving circuit 232, the third driving circuit 233, the first intercoupling circuit 250A and the second intercoupling circuit 250B are symmetrical with respect to the boundary where the first light receiving circuit 210 and the second light receiving circuit 220 adjoin each other, the plurality of unit pixels in the pixel block 110 may have uniform operation characteristics.

Figure 4:
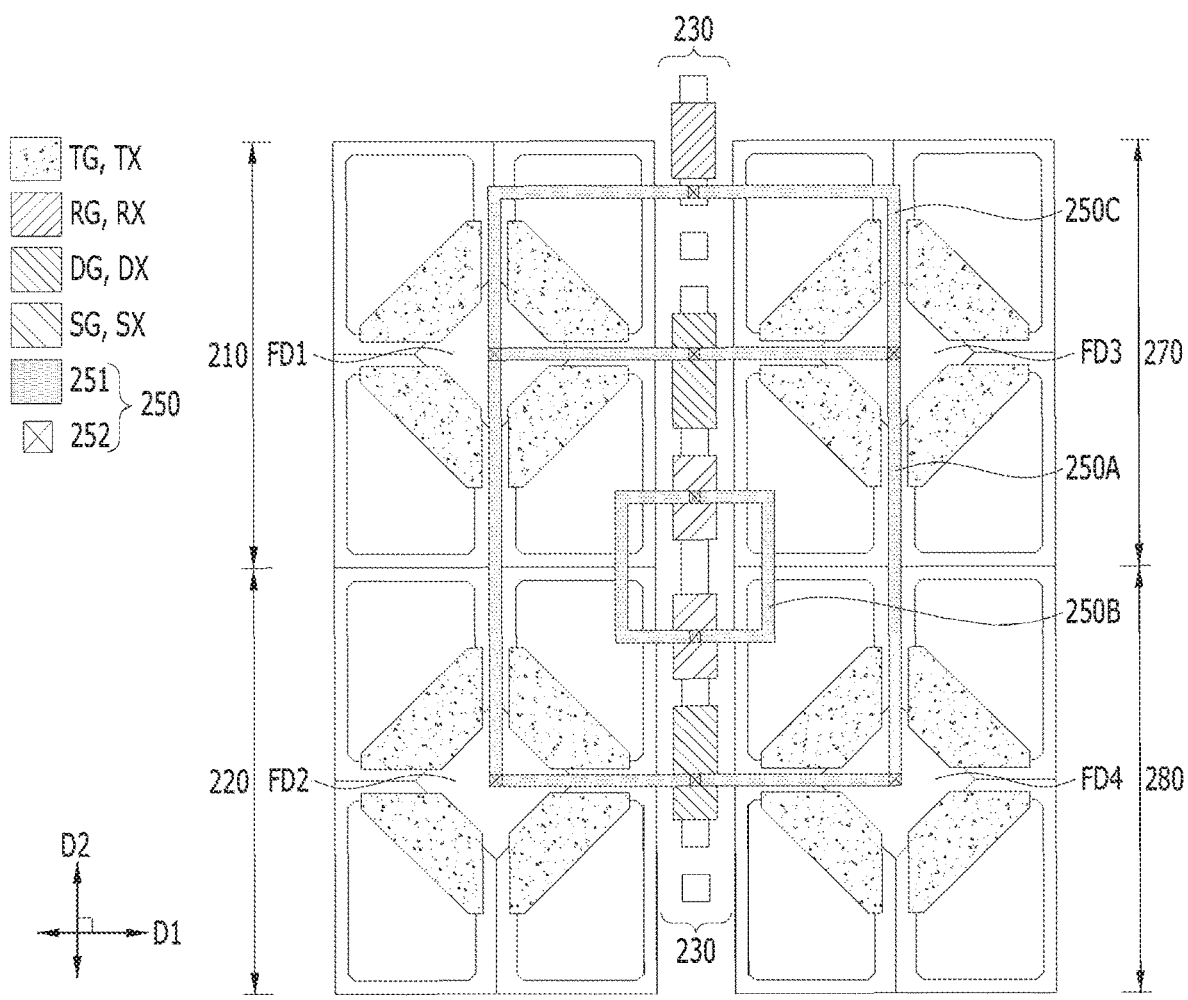
FIG. 4 is a layout illustrating an example of a pixel block of an image sensor based on a modification of the layout illustrated in FIG. 1.

FIG. 4 is a layout illustrating an example of a pixel block of an image sensor based on a modification of the layout illustrated in FIG. 1. Inasmuch as many elements are substantially identical to the elements illustrated in FIGS. 1 to 3, only different features will be described here.

As shown in FIGS. 1 and 4, the image sensor implemented based on a modification of the layout discussed above may include a pixel array 100 in which a plurality of pixel blocks 110 are arranged. In the pixel array 100, the plurality of pixel blocks 110 may be arranged in a matrix structure.

Each of the plurality of pixel blocks 110 may have a 16-shared pixel structure. The 16-shared pixel structure may facilitate the enlargement of the pixel transistor size compared to a 4-shared pixel structure and an 8-shared pixel structure. Each of the plurality of pixel blocks 110 may include a first light receiving circuit 210, which includes a plurality of unit pixels sharing a first floating diffusion FD1, a second light receiving circuit 220, which includes a plurality of unit pixels sharing a second floating diffusion FD2, a third light receiving circuit 270, which includes a plurality of unit pixels sharing a third floating diffusion FD3, a fourth light receiving circuit 280, which includes a plurality of unit pixels sharing a fourth floating diffusion FD4, a driving circuit 230, which includes a reset transistor RX, a driver transistor DX and a selection transistor SX, and an intercoupling circuit 250, which electrically couples the first light receiving circuit 210 to the fourth light receiving circuit 280 and the driving circuit 230.

In each of the plurality of pixel blocks 110, the first light receiving circuit 210 to the fourth light receiving circuit 280 may generate photocharges in response to incident light. The first light receiving circuit 210 to the fourth light receiving circuit 280 may have the same two-dimensional configuration. For example, each of the first light receiving circuit 210 to the fourth light receiving circuit 280 may include four unit pixels that share a floating diffusion and are arranged in a 2×2 matrix structure. The first light receiving circuit 210 and the second light receiving circuit 220, and the third light receiving circuit 270 and the fourth light receiving circuit 280 may be positioned adjacent to each other, and may be aligned in the second direction D2. The first light receiving circuit 210 and the third light receiving circuit 270, and the second light receiving circuit 220 and the fourth light receiving circuit 280 may be positioned adjacent to each other, and may be aligned in the first direction D1. The first floating diffusion FD1 to the fourth floating diffusion FD4 may be electrically coupled to one another through the intercoupling circuit 250.

In each of the plurality of pixel blocks 110, the driving circuit 230 may be positioned between the first light receiving circuit 210 and the third light receiving circuit 270 and between the second light receiving circuit 220 and the fourth light receiving circuit 280. Since the configuration of the driving circuit 230 is the same as in the first embodiment, detailed descriptions thereof will be omitted herein.

A first intercoupling circuit 250A and a second intercoupling circuit 250B may be symmetrical with respect to the boundary where the first light receiving circuit 210 and the second light receiving circuit 220 adjoin each other and the boundary where the third light receiving circuit 270 and the fourth light receiving circuit 280 adjoin each other. Further, the first intercoupling circuit 250A and the second intercoupling circuit 250B may be symmetrical with respect to the driving circuit 230. Therefore, the first intercoupling circuit 250A and the second intercoupling circuit 250B may have ring-type shapes.

As described above, the pixel block 110 of the image sensor in accordance with the modification of the first embodiment may easily improve the degree of integration of a shared pixel structure.

Figure 5:
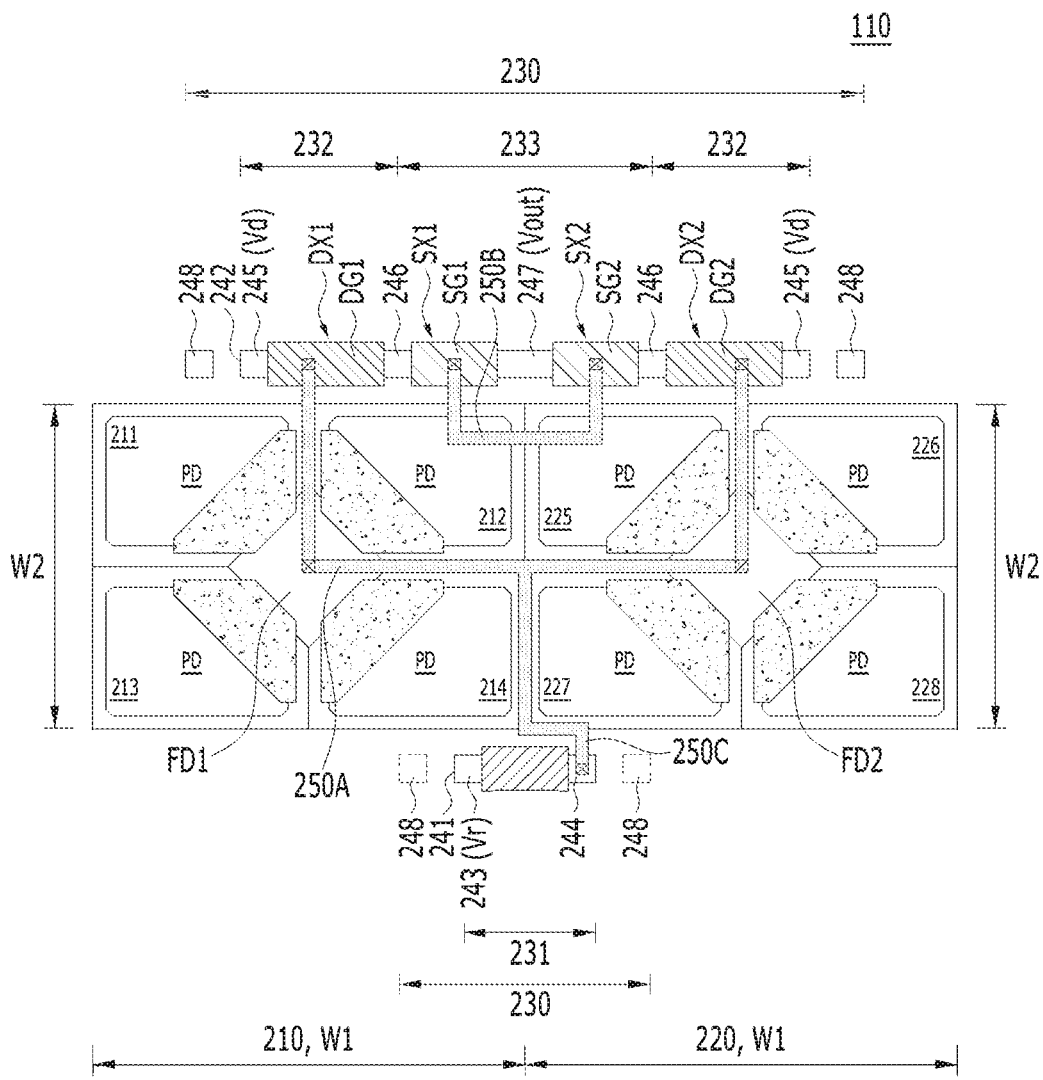
FIG. 5 is a layout illustrating an example of a pixel block of an image sensor based on another embodiment of the disclosed technology.

FIG. 5 is a layout illustrating an example of a pixel block of an image sensor based on another embodiment of the disclosed technology.

As shown in FIGS. 2 and 5, the image sensor implemented based on another embodiment of the disclosed technology may include a pixel array 100 in which a plurality of pixel blocks 110 are arranged. In the pixel array 100, the plurality of pixel blocks 110 may be arranged in a zigzag form (see FIG. 6).

Each of the plurality of pixel blocks 110 may have a shared pixel structure. For example, each of the plurality of pixel blocks 110 may have an 8-shared pixel structure. The 8-shared pixel structure may facilitate the enlargement of the pixel transistor size compared to a 4-shared pixel structure. Each of the plurality of pixel blocks 110 may include a first light receiving circuit 210, which includes a plurality of unit pixels sharing a first floating diffusion FD1, a second light receiving circuit 220, which includes a plurality of unit pixels sharing a second floating diffusion FD2, a driving circuit 230, which includes a reset transistor RX, a driver transistor DX and a selection transistor SX, and an intercoupling circuit 250, which electrically couples the first light receiving circuit 210, the second light receiving circuit 220 and the driving circuit 230 to each other. For reference, the reset transistor RX, the driver transistor DX and the selection transistor SX may be referred to as pixel transistors.

In each of the plurality of pixel blocks 110, the first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels (e.g., a first unit pixel 211 to a fourth unit pixel 214), which share the first floating diffusion FD1 and are arranged in a 2×2 matrix structure. The second light receiving circuit 220 may include four unit pixels (e.g., a fifth unit pixel 225 to an eighth unit pixel 228), which share the second floating diffusion FD2 and are arranged in a 2×2 matrix structure. The first light receiving circuit 210 and the second light receiving circuit 220 may be positioned adjacent to each other, and may be aligned in the first direction D1. Therefore, the first floating diffusion FD1 and the second floating diffusion FD2 may also be aligned in the first direction D1. In other words, the first floating diffusion FD1 and the second floating diffusion FD2 may be positioned on the same line in the first direction D1. The first floating diffusion FD1 and the second floating diffusion FD2 may be electrically coupled to each other through the intercoupling circuit 250.

In each of the plurality of pixel blocks 110, the first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width extending in the row direction, and the second pitch W2 may be a width extending in the column direction. The first pitch W1 and the second pitch W2 may have the same length (W1=W2) or the first pitch W1 may be larger than the second pitch W2 due to the disposition of the driving circuit 230 in the pixel block 110 (W1>W2). It is illustrated in FIG. 5 that the first pitch W1 is larger than the second pitch W2.

In each of the plurality of pixel blocks 110, each of the first unit pixel 211 to the eighth unit pixel 228 may include a photoelectric conversion element PD, which generates photocharges in response to incident light, and a transfer transistor TX, which transfers the photocharges generated in the photoelectric conversion element PD, to the floating diffusion FD in response to a transfer signal TRF. The floating diffusion FD may temporarily store the photocharges transferred through the transfer transistor TX from the photoelectric conversion element PD. The photoelectric conversion element PD may include a photodiode, a phototransistor, a photogate, a pinned photodiode (PPD) or a combination thereof. In an embodiment of the disclosed technology, the photoelectric conversion element PD may include organic or/and inorganic photodiodes. For example, the photoelectric conversion element PD may include either organic and inorganic photodiodes, or may be formed by stacking an organic photodiode and an inorganic photodiode on top of one another. The transfer signal TRF may be generated in a row driver (see the reference numeral 150 of FIG. 15), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110, the driving circuit 230 may include a first driving circuit 231 to a third driving circuit 233. The driving circuit 230 may further include pickup regions 248 which are disposed adjacent to the second driving circuit 232. The first driving circuit 231 may initialize the first floating diffusion FD1, the second floating diffusion FD2 and the photoelectric conversion elements PD in response to a reset signal RST. The second driving circuit 232 may generate an output signal Vout corresponding to the photocharges generated in the light receiving circuits 210 and 220 in response to incident light. The third driving circuit 233 may output the output signal Vout, which is generated in the second driving circuit 232, in response to a select signal SEL. In the second direction D2, the first driving circuit 231 may be positioned at the other ends of the light receiving circuits 210 and 220, and the second driving circuit 232 and the third driving circuit 233 may be positioned at one ends of the light receiving circuits 210 and 220. For example, the first driving circuit 231 may be positioned at lower ends of the light receiving circuits 210 and 220, and the second driving circuit 232 and the third driving circuit 233 may be positioned at upper ends of the light receiving circuits 210 and 220. The second driving circuit 232 and the third driving circuit 233 may be aligned in the first direction D1. The above-described shape of the driving circuit 230 may provide enough space for the first driving circuit 231 to the third driving circuit 233 to be formed. Further, the shape of the driving circuit 230 may help prevent the interference between the first driving circuit 231 and the second and third driving circuits 232 and 233. Moreover, the shape of the driving circuit 230 may help prevent characteristic degradation that may be caused by the presence of the intercoupling circuit 250 which electrically couples the light receiving circuits 210 and 220 to the driving circuit 230. Because the shape of the driving circuit 230 allows the intercoupling circuit 250 to have a symmetrical shape, it is possible to prevent variations in the operation characteristics of the plurality of unit pixels.

In each of the plurality of pixel blocks 110, the first driving circuit 231 may initialize the first floating diffusion FD1, the second floating diffusion FD2 and the photoelectric conversion elements PD in response to the reset signal RST. To this end, the first driving circuit 231 may include at least one reset transistor RX. In FIG. 5, it is illustrated that the first driving circuit 231 includes one reset transistor RX. The reset signal RST may be generated in the row driver (see the reference numeral 150 of FIG. 15), and may be applied to the reset transistor RX through a row line (not shown) which extends from the row driver and is coupled to a reset gate RG.

In each of the plurality of pixel blocks 110, the first driving circuit 231 may include a first active region 241, the reset gate RG which is formed on the first active region 241, and a first junction region 243 and a second junction region 244 which are formed in the first active region 241 at both sides of the reset gate RG. The first active region 241 may have a bar shape that has a major axis extending in the first direction D1 and a minor axis extends in the second direction D2. The reset signal RST may be applied to the reset gate RG. The first junction region 243 may be the drain of the reset transistor RX. The reset transistor RX may be supplied with a reset voltage Vr through the first junction region 243. The reset voltage Vr may be a positive voltage. For example, the reset voltage Vr may be a power supply voltage (VDD) or a positive voltage larger than the power supply voltage (VDD). The second junction region 244 may be the source of the reset transistor RX. The second junction region 244 may be electrically coupled to the intercoupling circuit 250, and may be electrically coupled to the first floating diffusion FD1 and the second floating diffusion FD2 through the intercoupling circuit 250.

In each of the plurality of pixel blocks 110, the first driving circuit 231 may be positioned at the other ends of the light receiving circuits 210 and 220 in the second direction D2, and may be positioned at the boundary where the first light receiving circuit 210 and the second light receiving circuit 220 adjoin each other. For example, the first driving circuit 231 may be positioned adjacent to the fourth unit pixel 214 of the first light receiving circuit 210 and the seventh unit pixel 227 of the second light receiving circuit 220, and, in the second direction D2, the center of the reset gate RG may be aligned along the boundary where the first light receiving circuit 210 and the second light receiving circuit 220 adjoin each other. Thus, the first driving circuit 231 may have be symmetrical with respect to the boundary where the first light receiving circuit 210 and the second light receiving circuit 220 adjoin each other. As the first driving circuit 231 is formed at the other ends of the light receiving circuits 210 and 220 in the second direction D2, it is possible to easily provide a space for the second driving circuit 232 and the third driving circuit 233 to be formed. Further, it is possible to prevent characteristic degradation that may be caused by the shape of the intercoupling circuit 250 which electrically couples the first floating diffusion FD1 and the second floating diffusion FD2 to the source of the reset transistor RX, and thus it is possible to minimize unwanted variations in the operation characteristics of the plurality of unit pixels that may be caused due to the presence of the intercoupling circuit 250.

In each of the plurality of pixel blocks 110, the second driving circuit 232 may generate the output signal Vout corresponding to the photocharges generated in the light receiving circuits 210 and 220 in response to incident light. To this end, the second driving circuit 232 may include at least one driver transistor DX. For example, the second driving circuit 232 may include a plurality of driver transistors DX which have a parallel coupling structure. In FIG. 5, it is illustrated that the second driving circuit 232 includes a first driver transistor DX1 and a second driver transistor DX2 coupled in parallel, and this layout helps increase the channel areas of the driver transistors DX compared to a case where the second driving circuit 232 has only one driver transistor DX. In particular, the layout including the first driver transistor DX1 and the second driver transistor DX2 coupled in parallel helps increase the effective channel widths of the driver transistors DX within a limited area. In this way, it is possible to improve the current driving force of the second driving circuit 232 and at the same time improve resistance to noise.

In each of the plurality of pixel blocks 110, the second driving circuit 232 may include a second active region 242 and first and second driver gates DG1 and DG2, which are formed on the second active region 242. The first driver gate DG1 and the second driver gate DG2 may be electrically coupled to the first floating diffusion FD1 and the second floating diffusion FD2 through the intercoupling circuit 250. The second active region 242 may have a bar shape that has a major axis extending in the first direction D1 and a minor axis extending in the second direction D1. Third junction regions 245 may be formed in the second active region 242 at one end of the first driver gate DG1 and at the other end of the second driver gate DG2. The third junction regions 245 may be the drains of the first driver transistor DX1 and the second driver transistor DX2. The first driver transistor DX1 and the second driver transistor DX2 may be supplied with a driver voltage Vd through the third junction regions 245. The driver voltage Vd may be a positive voltage. For example, the driver voltage Vd may be the power supply voltage (VDD) or a positive voltage larger than the power supply voltage (VDD). Fourth junction regions 246 may be formed in the second active region 242 at the other end of the first driver gate DG1 and at one end of the second driver gate DG2. The fourth junction regions 246 may be the sources of the first driver transistor DX1 and the second driver transistor DX2.

In each of the plurality of pixel blocks 110, the first driver transistor DX1 of the second driving circuit 232 may be positioned adjacent to the first light receiving circuit 210, and the second driver transistor DX2 may be positioned adjacent to the second light receiving circuit 220. The first driver transistor DX1 and the second driver transistor DX2 may have be symmetrical to each other with respect to the boundary where the first light receiving circuit 210 and the second light receiving circuit 220 adjoin each other. In this way, it is possible to prevent the operation characteristics of the plurality of unit pixels from becoming different. Further, it is possible to provide the intercoupling circuit 250 which has a symmetrical shape, and thus it is possible to effectively prevent unwanted variations in the operation characteristics of the plurality of unit pixels.

In each of the plurality of pixel blocks 110, the pickup regions 248 are to provide reference potential for the pixel block 110. In particular, the pickup regions 248 provide reference potential for the driving circuit 230 in the pixel block 110. For example, a ground voltage (VSS) may be supplied to the pixel block 110 through the pickup regions 248. As the reference potential, for example, the ground voltage (VSS) is provided to the pixel block 110 through the pickup regions 248 to improve the operational stability of the pixel block 110. In order to effectively improve the operational stability of the pixel block 110, the pickup regions 248 may be positioned adjacent to the second driving circuit 232. For example, the pickup regions 248 may be positioned adjacent to the drain of the first driver transistor DX1 and the drain of the second driver transistor DX2. In other words, the pickup regions 248 may be formed to be adjacent to the third junction regions 245 which are supplied with the driver voltage Vd. As the pickup regions 248 are disposed adjacent to the third junction regions 245 to which the power supply voltage (VDD) or a positive voltage larger than the power supply voltage (VDD) is applied, it is possible to prevent a variation in the driver voltage Vd supplied to the third junction regions 245. In this way, it is possible to prevent a variation in the output signal Vout generated in the second driving circuit 232, and the operational stability of the pixel block 110 may be improved. The variation of the driver voltage Vd may occur due to various causes, and may mean that the magnitude or potential of the driver voltage Vd changes. Because the second driving circuit 232 generates the output signal Vout by adjusting the magnitude of the driver voltage Vd to reflect the amount of the photocharges generated in the light receiving circuits 210 and 220, if a variation occurs in the driver voltage Vd, a variation may occur in the output signal Vout as well.

Figure 6:
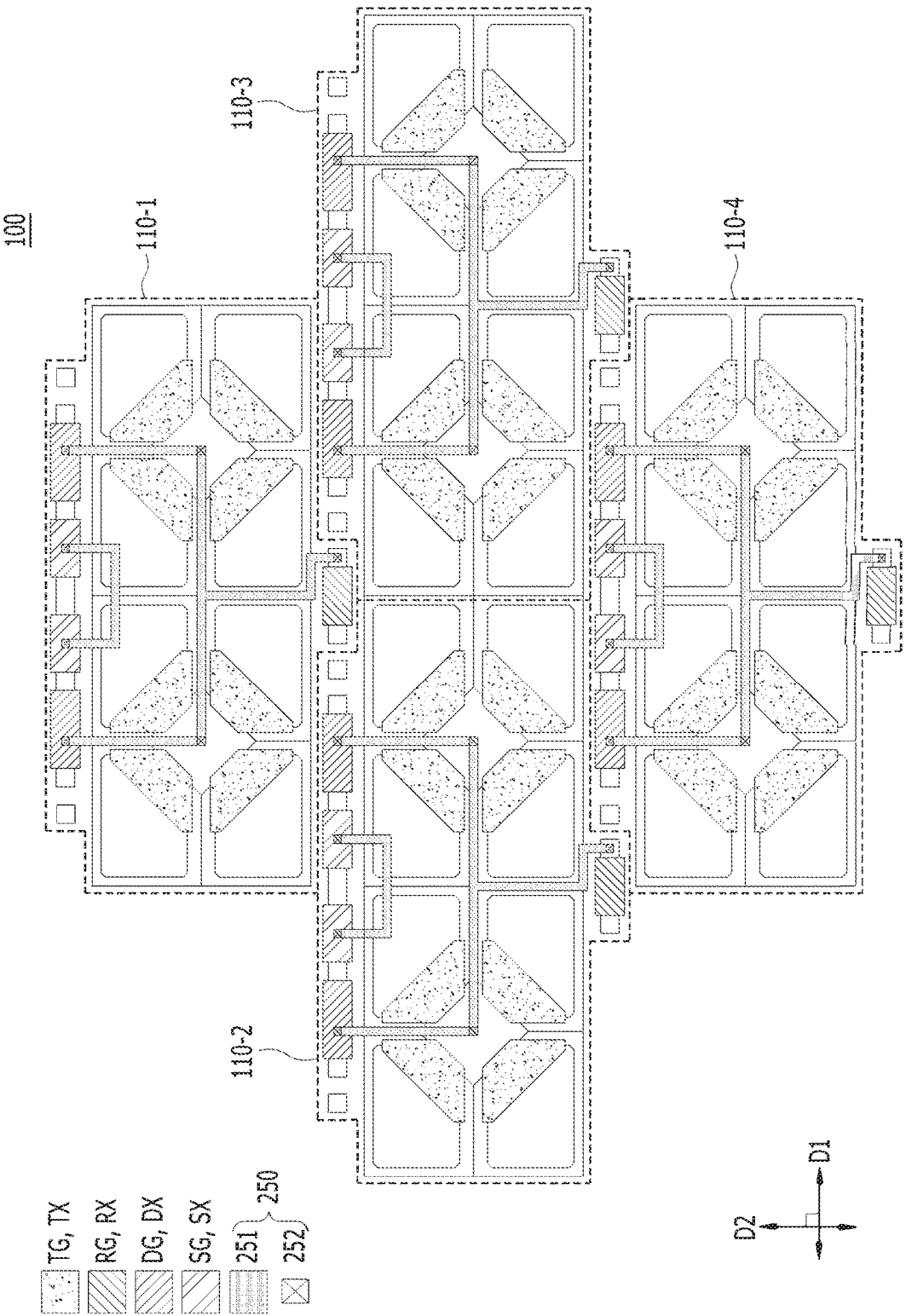
FIG. 6 is a layout illustrating an example of a portion of a pixel array of the image sensor illustrated in FIG. 5.

The pickup regions 248 of a second pixel block 110-2 and a third pixel block 110-3, which are adjacent in the second direction D2 to any one pixel block 110 (e.g., a first pixel block 110-1), among the plurality of pixel blocks 110, may be disposed to be adjacent to the drain and the source (e.g., the first junction region 243 and the second junction region 244) of the reset transistor RX in the first pixel block 110-1 (see FIG. 6). In this way, the operational stability of the pixel block 110 may be further improved.

In each of the plurality of pixel blocks 110, the third driving circuit 233 may output the output signal Vout, which is generated in the second driving circuit 232, in response to the select signal SEL. To this end, the third driving section 233 may include at least one selection transistor SX, which is coupled in series to the second driving circuit 232. For example, the third driving circuit 233 may include a plurality of selection transistors SX, which have a parallel coupling structure. In FIG. 5, it is illustrated that the third driving circuit 233 includes a first selection transistor SX1 and a second selection transistor SX2 coupled in parallel. The first selection transistor SX1 and the second selection transistor SX2 may synchronize with each other in response to the select signal SEL, and may share one output terminal OT. Therefore, this layout helps increase the channel areas compared to a case where the third driving circuit 233 includes only one selection transistor SX. In particular, the layout including the first selection transistor SX1 and the second selection transistor SX2 coupled in parallel helps increase the effective channel widths of the selection transistors SX within a limited area. In this way, it is possible to improve the current driving force of the third driving circuit 233 and at the same time improve resistance to noise. In an example embodiment of the disclosed technology, the select signal SEL may be generated in the row driver (see the reference numeral 150 of FIG. 15), and may be applied to the selection transistors SX through row lines (not shown) extending from the row driver and coupled to selection gates SG.

In each of the plurality of pixel blocks 110, the third driving circuit 233 may be positioned between the first driver transistor DX1 and the second driver transistor DX2. The first selection transistor SX1 may be coupled in series to the first driver transistor DX1, and the second selection transistor SX2 may be coupled in series to the second driver transistor DX2. The first selection transistor SX1 and the first driver transistor DX1, which are coupled in series, and the second selection transistor SX2 and the second driver transistor DX2, which are coupled in series, may share the second active region 242. In this way, it is possible to easily increase the sizes of the pixel transistors within a limited area. The first selection transistor SX1 and the second selection transistor SX2 may include a first selection gate SG1 and a second selection gate SG2 formed on the second active region 242. The first selection gate SG1 and the second selection gate SG2 may be electrically coupled to each other through the intercoupling circuit 250. The fourth junction regions 246 may be formed in the second active region 242 between the first selection gate SG1 and the first driver gate DG1 and between the second selection gate SG2 and the second driver gate DG2. The fourth junction regions 246 may be the drains of the first selection transistor SX1 and the second selection transistor SX2, and may be electrically coupled to the source of the first driver transistor DX1 and the source of the second driver transistor DX2. A fifth junction region 247 may be formed in the second active region 242 between the first selection gate SG1 and the second selection gate SG2. The fifth junction region 247 may be the source of the first selection transistor SX1 and the second selection transistor SX2, and the first selection transistor SX1 and the second selection transistor SX2 may share the source. Therefore, the third driving circuit 233 may have one output terminal OT, and the fifth junction region 247 may be the output terminal OT of the third driving circuit 233. The fifth junction region 247 may be coupled to a column line (not shown), and the output signal Vout may be transferred to the column line through the fifth junction region 247.

In each of the plurality of pixel blocks 110, the first selection transistor SX1 of the third driving circuit 233 may be positioned adjacent to the first light receiving circuit 210, and the second selection transistor SX2 may be positioned adjacent to the second light receiving circuit 220. The first selection transistor SX1 and the second selection transistor SX2 may be symmetrical to each other with respect to the boundary where the first light receiving circuit 210 and the second light receiving circuit 220 adjoin each other. The boundary where the first light receiving circuit 210 and the second light receiving circuit 220 adjoin each other and the source of the first selection transistor SX1 and the second selection transistor SX2 (e.g., the fifth junction region 247) may be aligned in the second direction D2. In this way, it is possible to prevent the operation characteristics of the plurality of unit pixels from becoming different. Furthermore, since the intercoupling circuit 250 which has a symmetrical shape may be provided, it is possible to effectively prevent unwanted variations in the operation characteristics of the plurality of unit pixels.

In each of the plurality of pixel blocks 110, the intercoupling circuit 250 may include a first intercoupling circuit 250A to a third intercoupling circuit 250C. The first intercoupling circuit 250A may electrically couple the first floating diffusion FD1, the second floating diffusion FD2, the first driver gate DG1 and the second driver gate DG2. The first intercoupling circuit 250A may be symmetrical with respect to the boundary where the first light receiving circuit 210 and the second light receiving circuit 220 adjoin each other. The second intercoupling circuit 250B may electrically couple the first selection gate SG1 to the second selection gate SG2. Through the second intercoupling circuit 250B, the first selection transistor SX1 and the second selection transistor SX2 may synchronize with each other in response to the select signal SEL. The second intercoupling circuit 250B may be electrically decoupled from the first intercoupling circuit 250A and the third intercoupling circuit 250C, and may be symmetrical with respect to the boundary where the first light receiving circuit 210 and the second light receiving circuit 220 adjoin each other. The third intercoupling circuit 250C may electrically couple the first floating diffusion FD1 and the second floating diffusion FD2 to the first driving circuit 231 (e.g., the source of the reset transistor RX). The third intercoupling circuit 250C may extend from the first intercoupling circuit 250A and may overlap with the boundary where the first light receiving circuit 210 and the second light receiving circuit 220 adjoin each other. To these ends, the first intercoupling circuit 250A to the third intercoupling circuit 250C may include conductive lines 251 and contacts 252, which couple the conductive lines 251 to the first floating diffusion FD1, the second floating diffusion FD2, the source of the reset transistor RX, the first driver gate DG1, the second driver gate DG2, the first selection gate SG1 and the second selection gate SG2. The first intercoupling circuit 250A and the second intercoupling circuit 250B are symmetrical with respect to the boundary where the first light receiving circuit 210 and the second light receiving circuit 220 adjoin each other to maintain parasitic capacitances existing between the intercoupling circuit 250 and the plurality of unit pixels (e.g., the first unit pixel 211 to the eighth unit pixel 228) at a constant value, thereby allowing each of the plurality of unit pixels to have uniform characteristics. The third intercoupling circuit 250C formed to overlap with the boundary between the first light receiving circuit 210 and the second light receiving circuit 220 may minimize an overlapping area between the third intercoupling circuit 250C and the plurality of unit pixels and thereby minimize influences on the plurality of unit pixels that may result from the third intercoupling circuit 250C.

As described above, in the image sensor implemented based on some embodiments of the disclosed technology, since the second driving circuit 232 is configured by the plurality of driver transistors DX coupled in parallel helps increase the sizes of driver transistors DX (e.g., the channel areas of the driver transistors DX) within a limited area. Further, the second driving circuit 232 having the parallel coupling structure may help increase the effective channel widths of the driver transistors DX, and thus current driving force and resistance to noise may be improved.

Further, in the image sensor discussed above, the layout including the third driving circuit 233 configured by the plurality of selection transistors SX coupled in parallel helps increase the sizes of the selection transistors SX (e.g., the channel areas of the selection transistors SX) within a limited area. Further, the third driving circuit 233 having the parallel coupling structure may help increase the effective channel widths of the selection transistors SX, and thus current driving force and resistance to noise may be improved.

Also, since the first driving circuit 231, the second driving circuit 232, the third driving circuit 233, the first intercoupling circuit 250A and the second intercoupling circuit 250B are symmetrical with respect to the boundary where the first light receiving circuit 210 and the second light receiving circuit 220 adjoin each other, the plurality of unit pixels in the pixel block 110 may have uniform operation characteristics.

FIG. 6 is a layout illustrating an example of a portion of a pixel array of the image sensor illustrated in FIG. 5.

As shown in FIGS. 5 and 6, the pixel array 100 implemented based on another embodiment of the disclosed technology may include a plurality of pixel blocks 110 (e.g., 110-1, 110-2, 110-3, 110-4 as shown in FIG. 6) arranged in a zigzag form. For example, the first pixel block 110-1, among the plurality of pixel blocks 110, may be positioned adjacent to the second pixel block 110-2 and the third pixel block 110-3 in the second direction D2. In the second direction D2, the first light receiving circuit 210 of the first pixel block 110-1 may be aligned with the second light receiving circuit 220 of the second pixel block 110-2, and the second light receiving circuit 220 of the first pixel block 110-1 may be aligned with the first light receiving circuit 210 of the third pixel block 110-3. In the first direction D1, the first driving circuit 231 of the first pixel block 110-1 may be positioned between the second driving circuits 232 and the third driving circuits 233 of the second pixel block 110-2 and the third pixel block 110-3. In the first direction D1, the first driving circuit 231 of the first pixel block 110-1 may be aligned with the second driving circuits 232 and the third driving circuits 233 of the second pixel block 110-2 and the third pixel block 110-3. Further, in the second direction D2, the second pixel block 110-2 and the third pixel block 110-3 may be positioned adjacent to a fourth pixel block 110-4, and the fourth pixel block 110-4 may be aligned with the first pixel block 110-1.

As described above, as the plurality of pixel blocks 110 are disposed in a zigzag form in the pixel array 100, it is possible to dispose the driving circuits 230 of the plurality of pixel blocks 110 in a zigzag manner. In this way, in the plurality of pixel blocks 110, it is possible to suppress characteristic deterioration that may be caused by the interference between adjacent driving circuits 230.

Figure 7:
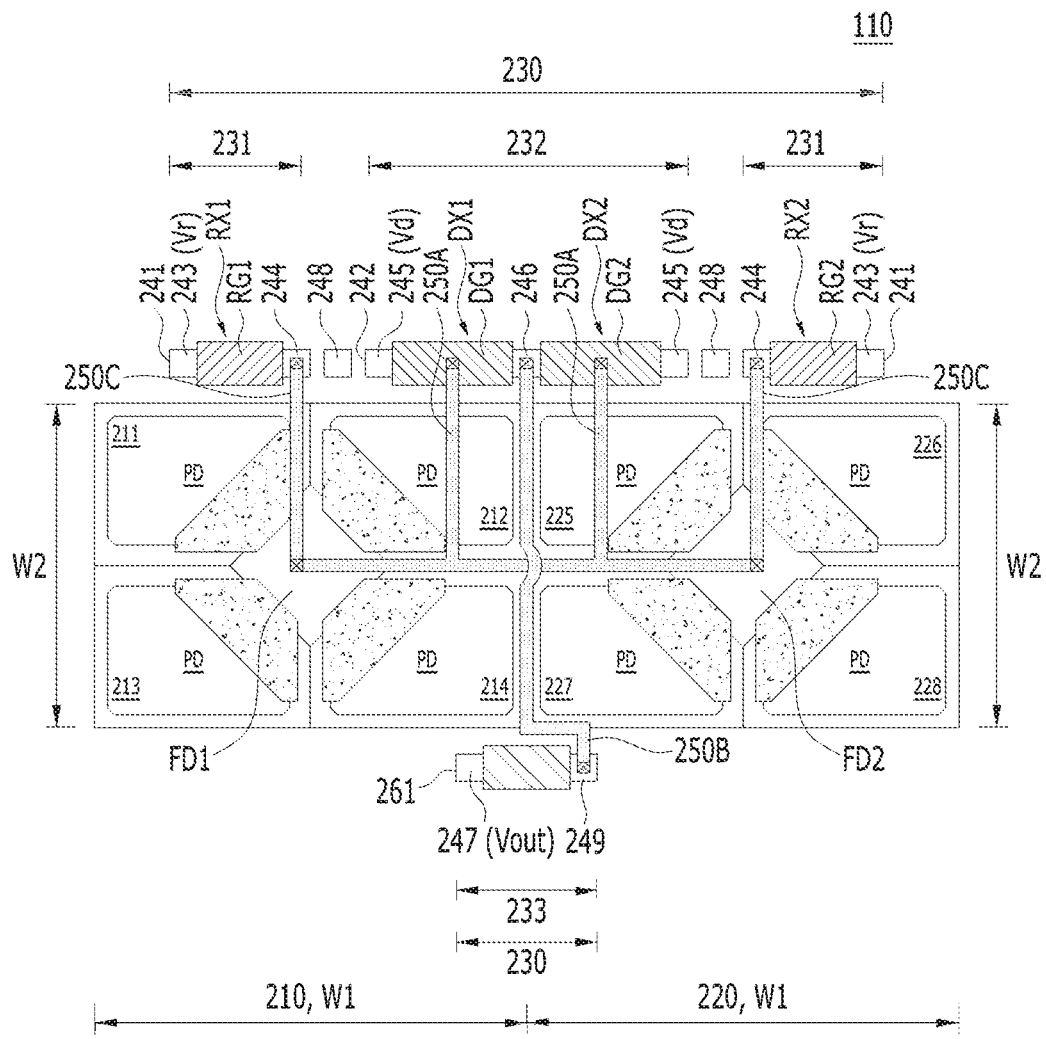
FIG. 7 is a layout illustrating an example of a pixel block of an image sensor based on yet another embodiment of the disclosed technology.
Figure 8:
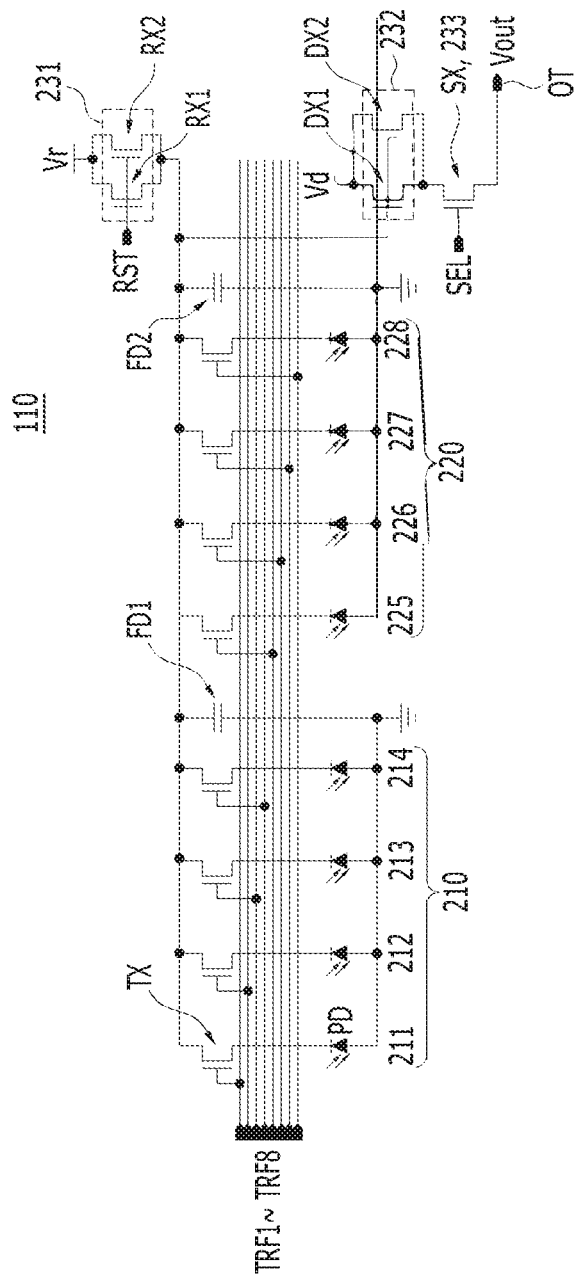
FIG. 8 is an equivalent circuit diagram corresponding to the pixel block of the image sensor illustrated in FIG. 7.

FIG. 7 is a layout illustrating an example of a pixel block of an image sensor based on yet another embodiment of the disclosed technology. FIG. 8 is an equivalent circuit diagram corresponding to the pixel block of the image sensor illustrated in FIG. 7.

As shown in FIGS. 7 and 8, the image sensor implemented based on some embodiments of the disclosed technology may include a pixel array 100 in which a plurality of pixel blocks 110 are arranged. In the pixel array 100, the plurality of pixel blocks 110 may be arranged in a zigzag form (see FIG. 9).

Each of the plurality of pixel blocks 110 may have a shared pixel structure. For example, each of the plurality of pixel blocks 110 may have an 8-shared pixel structure, which facilitates the enlargement of the pixel transistor size compared to a 4-shared pixel structure, it is possible to easily increase the sizes of pixel transistors. Each of the plurality of pixel blocks 110 may include a first light receiving circuit 210, which includes a plurality of unit pixels sharing a first floating diffusion FD1, a second light receiving circuit 220, which includes a plurality of unit pixels sharing a second floating diffusion FD2, a driving circuit 230, which includes a reset transistor RX, a driver transistor DX and a selection transistor SX, and an intercoupling circuit 250, which electrically couples the first light receiving circuit 210, the second light receiving circuit 220 and the driving circuit 230 to each other. For reference, the reset transistor RX, the driver transistor DX and the selection transistor SX may be referred to as pixel transistors.

In each of the plurality of pixel blocks 110, the first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels (e.g., a first unit pixel 211 to a fourth unit pixel 214), which share the first floating diffusion FD1 and are arranged in a 2×2 matrix structure. The second light receiving circuit 220 may include four unit pixels (e.g., a fifth unit pixel 225 to an eighth unit pixel 228), which share the second floating diffusion FD2 and are arranged in a 2×2 matrix structure. The first light receiving circuit 210 and the second light receiving circuit 220 may be positioned adjacent to each other, and may be aligned in the first direction D1. Therefore, the first floating diffusion FD1 and the second floating diffusion FD2 may also be aligned in the first direction D1. In other words, the first floating diffusion FD1 and the second floating diffusion FD2 may be positioned on the same line in the first direction D1. The first floating diffusion FD1 and the second floating diffusion FD2 may be electrically coupled to each other through the intercoupling circuit 250.

In each of the plurality of pixel blocks 110, the first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width extending in the row direction, and the second pitch W2 may be a width extending in the column direction. The first pitch W1 and the second pitch W2 may have the same size (W1=W2) or the first pitch W1 may be larger than the second pitch W2 due to the disposition of the driving circuit 230 in the pixel block 110 (W1>W2). It is illustrated in FIG. 7 that the first pitch W1 is larger than the second pitch W2.

In each of the plurality of pixel blocks 110, each of the first unit pixel 211 to the eighth unit pixel 228 may include a photoelectric conversion element PD which generates photocharges in response to incident light and a transfer transistor TX which transfers the photocharges generated in the photoelectric conversion element PD, to the floating diffusion FD in response to a transfer signal TRF. The floating diffusion FD may temporarily store the photocharges transferred through the transfer transistor TX from the photoelectric conversion element PD. The photoelectric conversion element PD may include a photodiode, a phototransistor, a photogate, a pinned photodiode (PPD) or a combination thereof. In some embodiments of the disclosed technology, the photoelectric conversion element PD may include organic or/and inorganic photodiodes. For example, the photoelectric conversion element PD may include either organic and inorganic photodiodes or may be formed by stacking an organic photodiode and an inorganic photodiode on top of one another. The transfer signal TRF may be generated in a row driver (see the reference numeral 150 of FIG. 15), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110, the driving circuit 230 may include a first driving circuit 231 to a third driving circuit 233. The driving circuit 230 may further include pickup regions 248 which are disposed adjacent to the second driving circuit 232. The first driving circuit 231 may initialize the first floating diffusion FD1, the second floating diffusion FD2 and the photoelectric conversion elements PD in response to a reset signal RST. The second driving circuit 232 may generate an output signal Vout corresponding to the photocharges generated in the light receiving circuits 210 and 220 in response to incident light. The third driving circuit 233 may output the output signal Vout, which is generated in the second driving circuit 232, in response to a select signal SEL. In the second direction D2, the third driving circuit 233 may be positioned at the other ends of the light receiving circuits 210 and 220, and the first driving circuit 231 and the second driving circuit 232 may be positioned at one ends of the light receiving circuits 210 and 220. For example, the third driving circuit 233 may be positioned at the lower ends of the light receiving circuits 210 and 220, and the first driving circuit 231 and the second driving circuit 232 may be positioned at the upper ends of the light receiving circuits 210 and 220. The first driving circuit 231 and the second driving circuit 232 may be aligned in the first direction D1. The above-described shape of the driving circuit 230 may provide enough space for the first driving circuit 231 to the third driving circuit 233 to be formed. Further, the shape of the driving circuit 230 may help prevent the interference between the first and second driving circuits 231 and 232 and the third driving circuit 233. Moreover, the shape of the driving circuit 230 may help prevent characteristic degradation that may be caused by the presence of the intercoupling circuit 250 which electrically couples the light receiving circuits 210 and 220 to the driving circuit 230. Because the shape of the driving circuit 230 allows the intercoupling circuit 250 to have a symmetrical shape, it is possible to prevent variations in the operation characteristics of the plurality of unit pixels.

In each of the plurality of pixel blocks 110, the first driving circuit 231 may initialize the first floating diffusion FD1, the second floating diffusion FD2, and the photoelectric conversion elements PD in response to the reset signal RST. To this end, the first driving circuit 231 may include at least one reset transistor RX. For example, the first driving circuit 231 may include a plurality of reset transistors RX which have a parallel coupling structure. In FIG. 7, as an example, it is illustrated that the first driving circuit 231 is includes a first reset transistor RX1 and a second reset transistor RX2 coupled in parallel. The first reset transistor RX1 and the second reset transistor RX2 may synchronize with each other in response to the reset signal RST. Therefore, this layout helps increase the channel areas compared to a case where the first driving circuit 231 includes only one reset transistor RX. In particular, the layout including the first reset transistor RX1 and the second reset transistor RX2 coupled in parallel helps increase the effective channel widths of the reset transistors RX within a limited area. In this way, it is possible to improve the current driving force of the first driving circuit 231 and at the same time improve resistance to noise. In some example embodiments of the disclosed technology, the reset signal RST may be generated in the row driver (see the reference numeral 150 of FIG. 15), and may be applied to the reset transistors RX through row lines (not shown) extending from the row driver and coupled to reset gates RG.

In each of the plurality of pixel blocks 110, the first driving circuit 231 may include first active regions 241, a first reset gate RG1 and a second reset gate RG2, which are formed on the first active regions 241, and first junction regions 243 and second junction regions 244, which are formed in the first active regions 241 at both sides of the first reset gate RG1 and the second reset gate RG2. The first active region 241 for the first reset transistor RX1 and the first active region 241 for the second reset transistor RX2 may be separated from each other. Each of the first active regions 241 may have a bar shape that has a major axis extending in the first direction D1 and a minor axis extending in the second direction D2. While not shown in the drawings, the first reset gate RG1 and the second reset gate RG2 may be electrically coupled to each other. Accordingly, the first reset transistor RX1 and the second reset transistor RX2 may synchronize with each other in response to the reset signal RST. The reset signal RST may be applied to the first reset gate RG1 and the second reset gate RG2. The first junction regions 243 may be the drains of the first reset transistor RX1 and the second reset transistor RX2. The first reset transistor RX1 and the second reset transistor RX2 may be supplied with a reset voltage Vr through the first junction regions 243. The reset voltage Vr may be a positive voltage. For example, the reset voltage Vr may be a power supply voltage (VDD) or a positive voltage larger than the power supply voltage (VDD). The second junction regions 244 may be the sources of the first reset transistor RX1 and the second reset transistor RX2. The second junction regions 244 may be electrically coupled to the intercoupling circuit 250, and the sources of the first reset transistor RX1 and the second reset transistor RX2 may be electrically coupled to the first floating diffusion FD1 and the second floating diffusion FD2 through the intercoupling circuit 250. The second junction regions 244 may be positioned more adjacent to the first floating diffusion FD1 and the second floating diffusion FD2 than the first junction regions 243.

In each of the plurality of pixel blocks 110, the first driving circuit 231 may be positioned at one ends of the light receiving circuits 210 and 220 in the second direction D2. In the first driving circuit 231, the first reset transistor RX1 may be positioned adjacent to the first light receiving circuit 210, and the second reset transistor RX2 may be positioned adjacent to the second light receiving circuit 220. For example, the first reset transistor RX1 may be positioned adjacent to the first unit pixel 211 of the first light receiving circuit 210, and the second reset transistor RX2 may be positioned adjacent to the sixth unit pixel 226 of the second light receiving circuit 220. The first driving circuit 231 may be symmetrical with respect to the boundary where the first light receiving circuit 210 and the second light receiving circuit 220 adjoin each other. In this way, it is possible to prevent variations in the operation characteristics of the plurality of unit pixels. Furthermore, the intercoupling circuit 250 having a symmetrical shape may help prevent unwanted variations in the operation characteristics of the plurality of unit pixels.

In each of the plurality of pixel blocks 110, the second driving circuit 232 may generate the output signal Vout corresponding to the photocharges generated in the light receiving circuits 210 and 220 in response to incident light. To this end, the second driving circuit 232 may include at least one driver transistor DX. For example, the second driving circuit 232 may include a plurality of driver transistors DX which have a parallel coupling structure. In FIG. 7, it is illustrated that the second driving circuit 232 includes a first driver transistor DX1 and a second driver transistor DX2 coupled in parallel, and this layout helps increase the channel areas compared to a case where the second driving circuit 232 includes only one driver transistor DX. In particular, the layout including the first driver transistor DX1 and the second driver transistor DX2 coupled in parallel helps increase the effective channel widths of the driver transistors DX within a limited area. In this way, it is possible to improve the current driving force of the second driving circuit 232 and at the same time improve resistance to noise.

In each of the plurality of pixel blocks 110, the second driving circuit 232 may be positioned between the first reset transistor RX1 and the second reset transistor RX2. The first driver transistor DX1 and the second driver transistor DX2 may include a second active region 242, and a first drier gate DG1 and a second driver gate DG2 formed on the second active region 242. The first driver gate DG1 and the second driver gate DG2 may be electrically coupled to the first floating diffusion FD1 and the second floating diffusion FD2 through the intercoupling circuit 250. The second active region 242 may have a bar shape that has a major axis extending in the first direction D1 and a minor axis extending in the second direction D2. Third junction regions 245 may be formed in the second active region 242 at one end of the first driver gate DG1 and at the other end of the second driver gate DG2. The third junction regions 245 may be the drains of the first driver transistor DX1 and the second driver transistor DX2. The first driver transistor DX1 and the second driver transistor DX2 may be supplied with a driver voltage Vd through the third junction regions 245. The driver voltage Vd may be a positive voltage. For example, the driver voltage Vd may be the power supply voltage (VDD) or a positive voltage larger than the power supply voltage (VDD). A fourth junction region 246 may be formed in the second active region 242 between the first driver gate DG1 and the second driver gate DG2. The fourth junction region 246 may be the source of the first driver transistor DX1 and the second driver transistor DX2. In the second direction D2, the fourth junction region 246 may be aligned with the boundary where the first light receiving circuit 210 and the second light receiving circuit 220 adjoin each other.

In each of the plurality of pixel blocks 110, the second driving circuit 232 may be positioned at one ends of the light receiving circuits 210 and 220 in the second direction D2, and may be aligned with the first driving circuit 231 in the first direction D1. The first driver transistor DX1 of the second driving circuit 232 may be positioned adjacent to the first light receiving circuit 210, and the second driver transistor DX2 may be positioned adjacent to the second light receiving circuit 220. For example, the first driver transistor DX1 may be positioned adjacent to the second unit pixel 212 of the first light receiving circuit 210, and the second driver transistor DX2 may be positioned adjacent to the fifth unit pixel 225 of the second light receiving circuit 220. The first driver transistor DX1 and the second driver transistor DX2 may be symmetrical to each other with respect to the boundary where the first light receiving circuit 210 and the second light receiving circuit 220 adjoin each other. In this way, it is possible to prevent unwanted variations in the operation characteristics of the plurality of unit pixels from. Furthermore, the intercoupling circuit 250 having a symmetrical shape may help prevent unwanted variations in the operation characteristics of the plurality of unit pixels.

In each of the plurality of pixel blocks 110, the pickup regions 248 provide reference potential for the pixel block 110. In particular, the pickup regions 248 provide reference potential for the driving circuit 230 in the pixel block 110. For example, a ground voltage (VSS) may be supplied to the pixel block 110 through the pickup regions 248. As the reference potential, for example, the ground voltage (VSS) is provided to the pixel block 110 through the pickup regions 248 to improve the operational stability of the pixel block 110. In order to effectively improve the operational stability of the pixel block 110, the pickup regions 248 may be positioned adjacent to the second driving circuit 232. For example, the pickup regions 248 may be positioned adjacent to the drain of the first driver transistor DX1 and the drain of the second driver transistor DX2. In other words, the pickup regions 248 may be formed to be adjacent to the third junction regions 245 which are supplied with the driver voltage Vd. As the pickup regions 248 are disposed adjacent to the third junction regions 245 to which the power supply voltage (VDD) or a positive voltage larger than the power supply voltage (VDD) is applied, it is possible to prevent a variation in the driver voltage Vd supplied to the third junction regions 245. In this way, it is possible to prevent a variation in the output signal Vout generated in the second driving circuit 232, and the operational stability of the pixel block 110 may be improved. The variation of the driver voltage Vd may occur due to various causes, and may mean that the magnitude or potential of the driver voltage Vd changes. Because the second driving circuit 232 generates the output signal Vout by adjusting the magnitude of the driver voltage Vd to reflect the amount of the photocharges generated in the light receiving circuits 210 and 220, if a variation occurs in the driver voltage Vd, a variation may occur in the output signal Vout as well.

In each of the plurality of pixel blocks 110, the third driving circuit 233 may output the output signal Vout generated in the second driving circuit 232, in response to the select signal SEL. To this end, the third driving section 233 may include at least one selection transistor SX coupled in series to the second driving circuit 232. In FIG. 7, it is illustrated that the third driving circuit 233 includes one selection transistor SX. The select signal SEL may be generated in the row driver (see the reference numeral 150 of FIG. 15), and may be applied to the selection transistor SX through a row line (not shown) extending from the row driver and coupled to a selection gate SG.

In each of the plurality of pixel blocks 110, the third driving circuit 233 may include a third active region 261, the selection gate SG, which is formed on the third active region 261, and a fifth junction region 247 and a sixth junction region 249, which are formed in the third active region 261 at both sides of the selection gate SG. The third active region 261 may have a bar shape that has a major axis extending in the first direction D1 and a minor axis extending in the second direction D2. The select signal SEL may be applied to the selection gate SG. The sixth junction region 249 may be the drain of the selection transistor SX, and may be coupled to the fourth junction region 246 of the second driving circuit 232 through the intercoupling circuit 250. In other words, the drain of the selection transistor SX may be electrically coupled to the source of the first driver transistor DX1 and the source of the second driver transistor DX2. The fifth junction region 247 may be the source of the selection transistor SX, and may be an output terminal OT of the third driving circuit 233. The fifth junction region 247 may be coupled to a column line (not shown), and the output signal Vout may be transferred to the column line through the fifth junction region 247.

In each of the plurality of pixel blocks 110, the third driving circuit 233 may be positioned at the other ends of the light receiving circuits 210 and 220 in the second direction D2, and may be positioned at the boundary where the first light receiving circuit 210 and the second light receiving circuit 220 adjoin each other. For example, the third driving circuit 233 may be positioned adjacent to the fourth unit pixel 214 of the first light receiving circuit 210 and the seventh unit pixel 227 of the second light receiving circuit 220, and, in the second direction D2, the center of the selection gate SG may be aligned with the boundary where the first light receiving circuit 210 and the second light receiving circuit 220 adjoin each other. Thus, the third driving circuit 233 may have be symmetrical with respect to the boundary where the first light receiving circuit 210 and the second light receiving circuit 220 adjoin each other. As the third driving circuit 233 is formed at the other ends of the light receiving circuits 210 and 220 in the second direction D2, it is possible to easily provide a space for the first driving circuit 231 and the second driving circuit 232 to be formed. Further, it is possible to prevent characteristic degradation that may be caused by the shape of the intercoupling circuit 250 which electrically couples the second driving circuit 232 to the third driving circuit 233, and thus it is possible to unwanted variations in the operation characteristics of the plurality of unit pixels that may be caused due to the presence of the intercoupling circuit 250.

In each of the plurality of pixel blocks 110, the intercoupling circuit 250 may include a first intercoupling circuit 250A to a third intercoupling circuit 250C. The first intercoupling circuit 250A may electrically couple the first floating diffusion FD1, the second floating diffusion FD2, the first driver gate DG1 and the second driver gate DG2. The first intercoupling circuit 250A may have a shape that extends from the third intercoupling circuit 250C. The first intercoupling circuit 250A may have be symmetrical with respect to the boundary where the first light receiving circuit 210 and the second light receiving circuit 220 adjoin each other. The second intercoupling circuit 250B may electrically couple the source of the first driver transistor DX1 and the source of the second driver transistor DX2 in the second driving circuit 232 to the drain of the selection transistor SX in the third driving circuit 233. The second intercoupling circuit 250B may be electrically decoupled from the first intercoupling circuit 250A and the third intercoupling circuit 250C, and may overlap with the boundary where the first light receiving circuit 210 and the second light receiving circuit 220 adjoin each other. The third intercoupling circuit 250C may electrically couple the first floating diffusion FD1, the second floating diffusion FD2, the source of the first reset transistor RX1 and the source of the second reset transistor RX2 to each other. The third intercoupling circuit 250C may be symmetrical with respect to the boundary where the first light receiving circuit 210 and the second light receiving circuit 220 adjoin each other. To these ends, the first intercoupling circuit 250A to the third intercoupling circuit 250C may include conductive lines 251 and contacts 252 which couple the conductive lines 251 to the first floating diffusion FD1, the second floating diffusion FD2, the source of the first reset transistor RX1, the source of the second reset transistor RX2, the first driver gate DG1, the second driver gate DG2 and the drain of the selection transistor SX. The first intercoupling circuit 250A and the third intercoupling circuit 250C are symmetrical with respect to the boundary where the first light receiving circuit 210 and the second light receiving circuit 220 adjoin each other to maintain the parasitic capacitances existing between the intercoupling circuit 250 and the plurality of unit pixels (e.g., the first unit pixel 211 to the eighth unit pixel 228) at a constant value, thereby allowing each of the plurality of unit pixels to have uniform characteristics. The second intercoupling circuit 250B formed to overlap with the boundary where the first light receiving circuit 210 and the second light receiving circuit 220 adjoin each other may minimize an overlapping area between the second intercoupling circuit 250B and the plurality of unit pixels and thereby minimize influences on the plurality of unit pixels that may result from the second intercoupling circuit 250B.

As described above, in the image sensor implemented based on some embodiments of the disclosed technology, since the second driving circuit 232 is configured by the plurality of driver transistors DX coupled in parallel helps increase the sizes of the driver transistors DX (e.g., the channel areas of the driver transistors DX) within a limited area. Further, the second driving circuit 232 having the parallel coupling structure may help increase the effective channel widths of the driver transistors DX, and thus current driving force and resistance to noise may be improved.

Further, in the image sensor discussed above, the layout including the first driving circuit 231 configured by the plurality of reset transistors RX coupled in parallel helps increase the sizes of the reset transistors RX (e.g., the channel areas of the reset transistors RX) within a limited area. Further, the first driving circuit 231 having the parallel coupling structure may help increase the effective channel widths of the reset transistors RX, and thus current driving force and resistance to noise may be improved.

Also, since the first driving circuit 231, the second driving circuit 232, the third driving circuit 233, the first intercoupling circuit 250A and the third intercoupling circuit 250C are symmetrical with respect to the boundary where the first light receiving circuit 210 and the second light receiving circuit 220 adjoin each other, the plurality of unit pixels in the pixel block 110 may have uniform operation characteristics.

Figure 9:
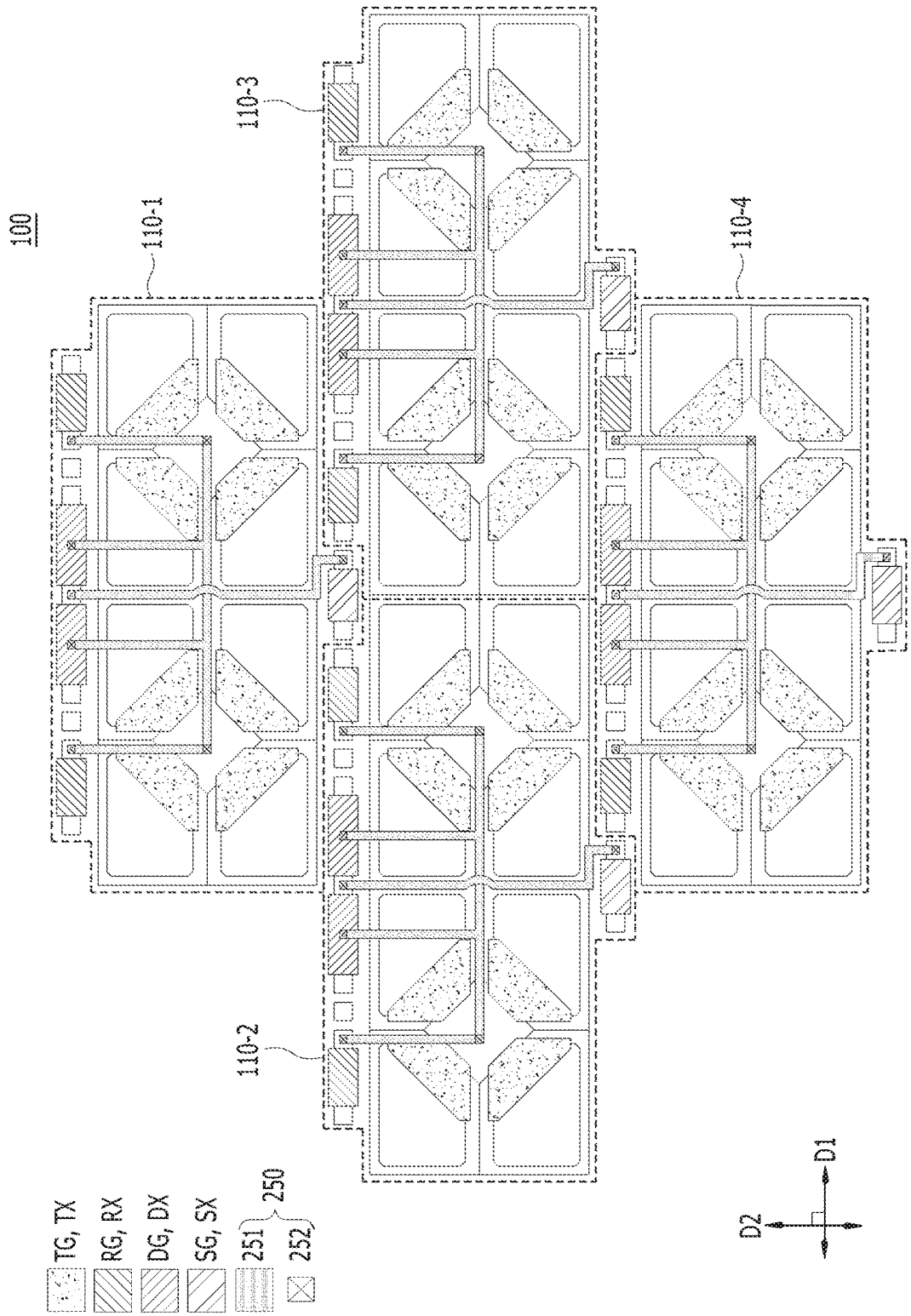
FIG. 9 is a layout illustrating an example of a portion of a pixel array of the image sensor illustrated in FIG. 7.

FIG. 9 is a layout illustrating an example of a portion of a pixel array of the image sensor illustrated in FIG. 7.

As shown in FIGS. 7 and 9, the pixel array 100 in accordance with the third embodiment may include a plurality of pixel blocks 110 (e.g., 110-1, 110-2, 110-3, 110-4 as shown in FIG. 9) arranged in a zigzag form. For example, a first pixel block 110-1 among the plurality of pixel blocks 110 may be positioned adjacent to a second pixel block 110-2 and a third pixel block 110-3 in the second direction D2. In the second direction D2, the first light receiving circuit 210 of the first pixel block 110-1 may be aligned with the second light receiving circuit 220 of the second pixel block 110-2, and the second light receiving circuit 220 of the first pixel block 110-1 may be aligned with the first light receiving circuit 210 of the third pixel block 110-3. In the first direction D1, the third driving circuit 233 of the first pixel block 110-1 may be positioned between the first driving circuit 231 of the second pixel block 110-2 and the first driving circuit 231 the third pixel block 110-3. In the first direction D1, the third driving circuit 233 of the first pixel block 110-1, and the first driving circuits 231 and the second driving circuits 232 of the second pixel block 110-2 and the third pixel block 110-3 may be aligned with one another. Further, in the second direction D2, the second pixel block 110-2 and the third pixel block 110-3 may be positioned adjacent to a fourth pixel block 110-4, and the fourth pixel block 110-4 may be aligned with the first pixel block 110-1.

As described above, as the plurality of pixel blocks 110 are disposed in a zigzag form in the pixel array 100, it is possible to dispose the driving circuits 230 of the plurality of pixel blocks 110 in a zigzag manner. In this way, in the plurality of pixel blocks 110, it is possible to suppress characteristic deterioration that may be caused by the interference between adjacent driving circuits 230.

Figure 10:
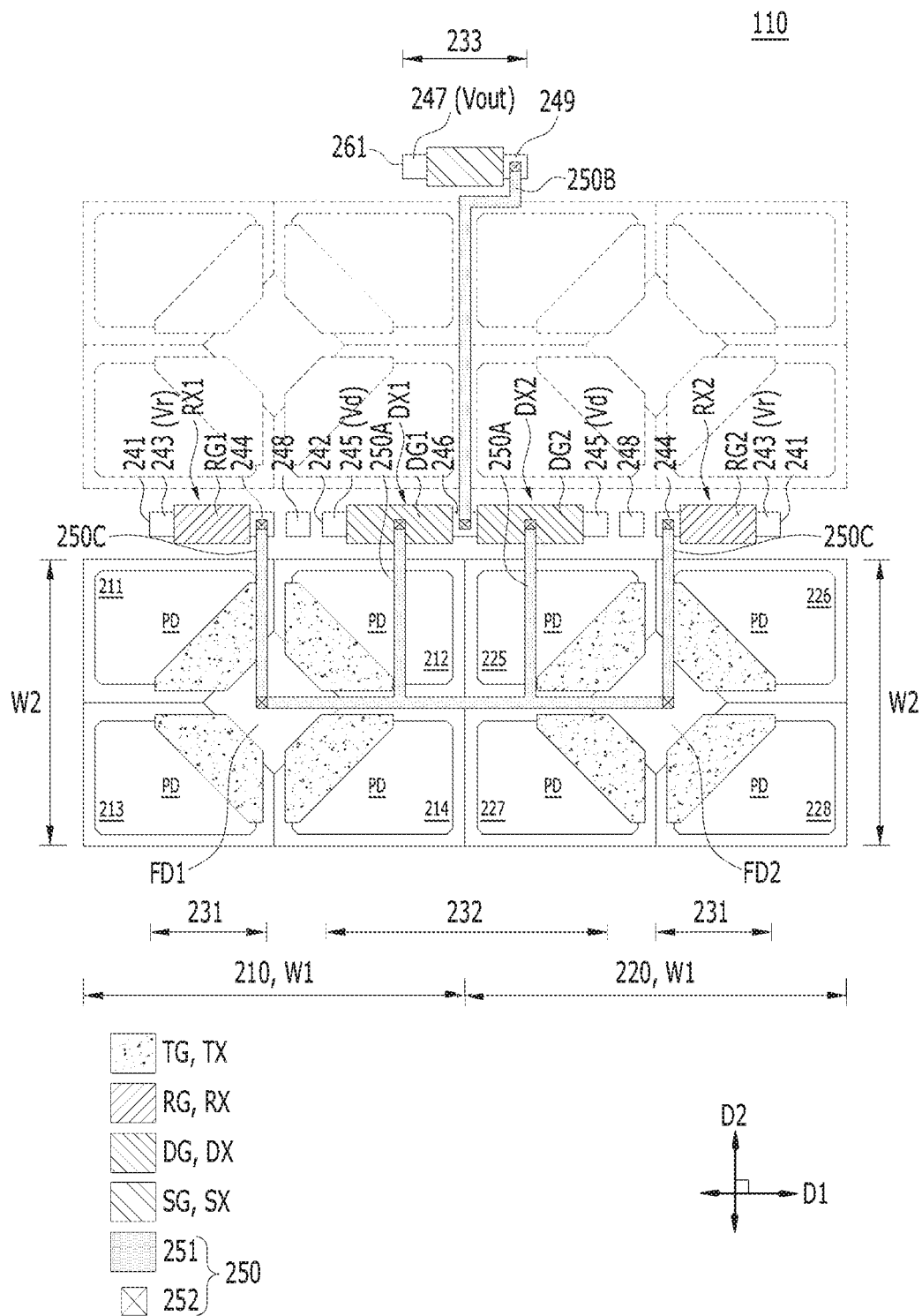
FIG. 10 is a layout illustrating an example of a pixel block of an image sensor based on a modification of the layout illustrated in FIG. 7.

FIG. 10 is a layout illustrating an example of a pixel block of an image sensor based on a modification of the layout illustrated in FIG. 7. Inasmuch as many elements are substantially identical to the elements illustrated in FIGS. 7 to 9, only different features will be described here.

As shown in FIGS. 7 and 10, the image sensor implemented based on some embodiments of the disclosed technology may include the plurality of pixel blocks 110 each including the first driving circuit 231 and the second driving circuit 232 positioned at one ends of the light receiving circuits 210 and 220 of a corresponding pixel block 110 in the second direction D2, and the third driving circuit 233 positioned at the other ends of the light receiving circuits 210 and 220. The image sensor implemented based on a modification of the layout discussed above, however, may include the plurality of pixel blocks 110 each including the first driving circuit 231 and the second driving circuit 232 positioned at one ends of the light receiving circuits 210 and 220 of a corresponding pixel block 110 in the second direction D2, and the third driving circuit 233 positioned at one ends of the light receiving circuits 210 and 220 of other adjacent pixel blocks 110 in the second direction D2. Namely, the third driving circuit 233 may be positioned at one ends of the light receiving circuits 210 and 220 of the corresponding pixel block 110 in the second direction D2, but may be separated by the second pitch W2 of the light receiving circuits 210 and 220 from the first driving circuit 231 and the second driving circuit 232. In this way, the second intercoupling circuit 250B may couple the second driving circuit 232 to the third driving circuit 233, and the interference between the first and second driving circuits 231 and 232 and the third driving circuit 233 may be effectively suppressed. Moreover, since the second intercoupling circuit 250B is formed along the boundary where the first light receiving circuit 210 and the second light receiving circuit 220 adjoin each other, it is possible to prevent unwanted variations in the operation characteristics of the plurality of unit pixels.

Figure 11:
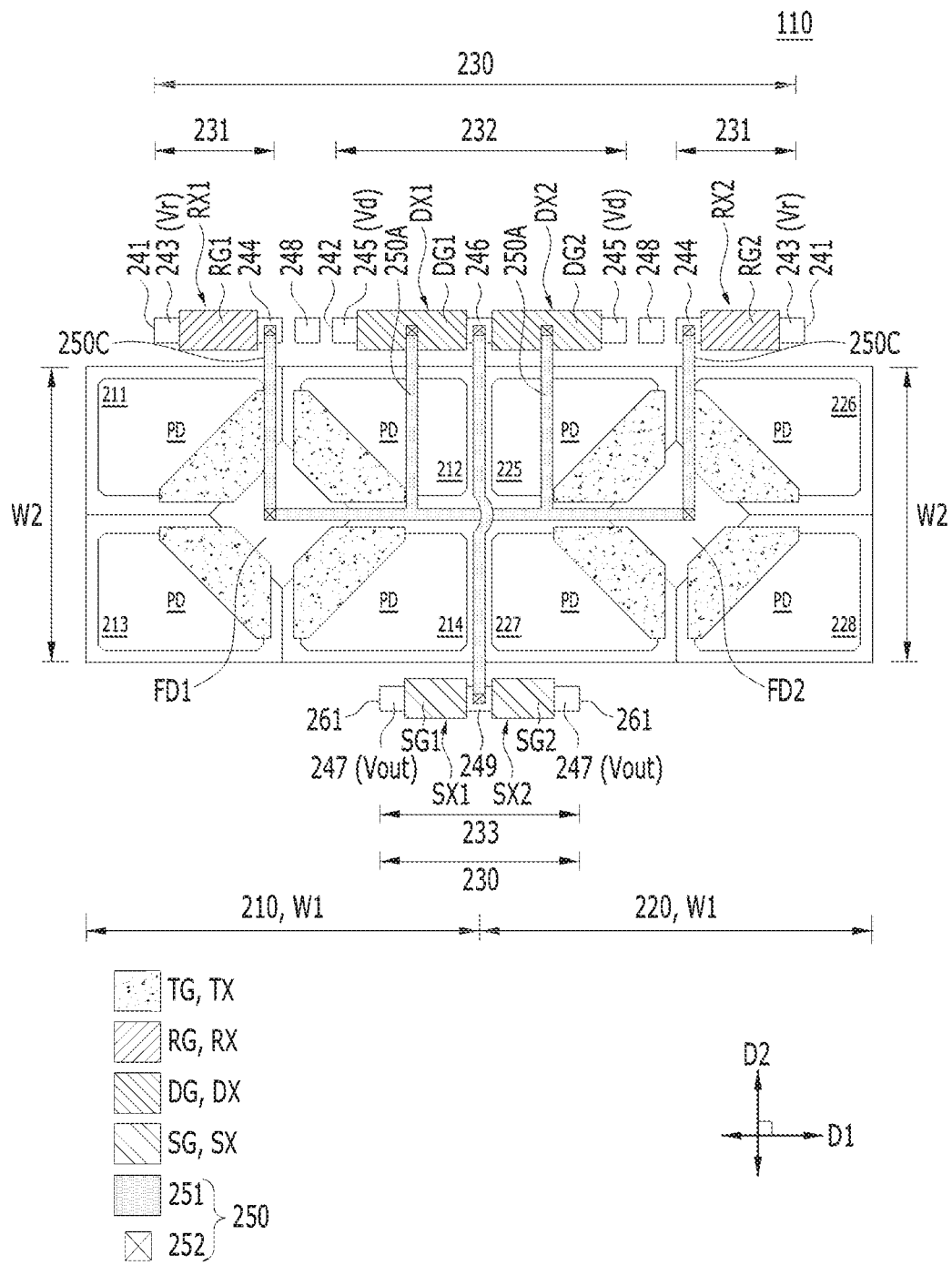
FIG. 11 is a layout illustrating an example of a pixel block of an image sensor based on yet another embodiment of the disclosed technology.
Figure 12:
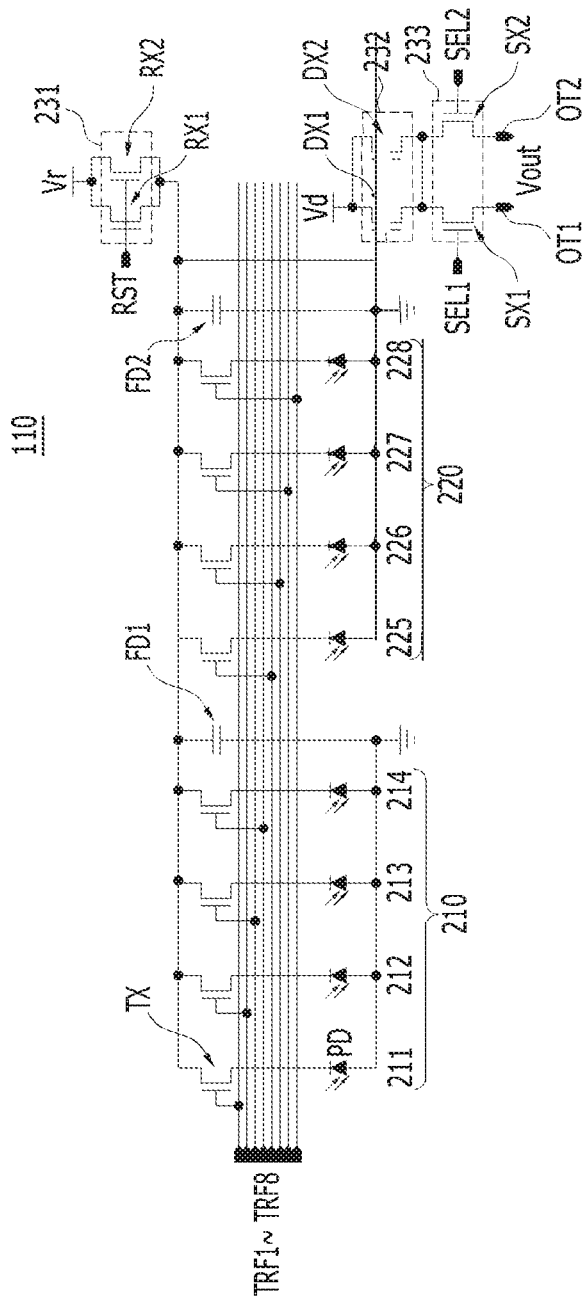
FIG. 12 is an equivalent circuit diagram corresponding to the pixel block of the image sensor illustrated in FIG. 11.

FIG. 11 is a layout illustrating an example of a pixel block of an image sensor based on yet another embodiment of the disclosed technology. FIG. 12 is an equivalent circuit diagram corresponding to the pixel block 110 of the image sensor illustrated in FIG. 11.

As shown in FIGS. 11 and 12, the image sensor implemented based on some embodiments of the disclosed technology may include a pixel array 100 in which a plurality of pixel blocks 110 are arranged. In the pixel array 100, the plurality of pixel blocks 110 may be arranged in a zigzag form (see FIG. 13).

Each of the plurality of pixel blocks 110 may have a shared pixel structure. For example, each of the plurality of pixel blocks 110 may have an 8-shared pixel structure, which facilitates the enlargement of the pixel transistor size compared to a 4-shared pixel structure, it is possible to easily increase the sizes of pixel transistors. Each of the plurality of pixel blocks 110 may include a first light receiving circuit 210, which includes a plurality of unit pixels sharing a first floating diffusion FD1, a second light receiving circuit 220 which includes a plurality of unit pixels sharing a second floating diffusion FD2, a driving circuit 230, which includes a reset transistor RX, a driver transistor DX and a selection transistor SX, and an intercoupling circuit 250, which electrically couples the first light receiving circuit 210, the second light receiving circuit 220 and the driving circuit 230 to each other. For reference, the reset transistor RX, the driver transistor DX and the selection transistor SX may be referred to as pixel transistors.

In each of the plurality of pixel blocks 110, the first light receiving circuit 210 and the second light receiving circuit 220 may generate photocharges in response to incident light. The first light receiving circuit 210 and the second light receiving circuit 220 may have the same two-dimensional configuration. For example, the first light receiving circuit 210 may include four unit pixels, that is, a first unit pixel 211 to a fourth unit pixel 214, which share the first floating diffusion FD1 and are arranged in a 2×2 matrix structure. The second light receiving circuit 220 may include four unit pixels (e.g., a fifth unit pixel 225 to an eighth unit pixel 228), which share the second floating diffusion FD2 and are arranged in a 2×2 matrix structure. The first light receiving circuit 210 and the second light receiving circuit 220 may be positioned adjacent to each other, and may be aligned in the first direction D1. Therefore, the first floating diffusion FD1 and the second floating diffusion FD2 may also be aligned in the first direction D1. In other words, the first floating diffusion FD1 and the second floating diffusion FD2 may be positioned on the same line in the first direction D1. The first floating diffusion FD1 and the second floating diffusion FD2 may be electrically coupled to each other through the intercoupling circuit 250.

In each of the plurality of pixel blocks 110, the first light receiving circuit 210 and the second light receiving circuit 220 may have a first pitch W1 and a second pitch W2 in the first direction D1 and the second direction D2, respectively. In the first light receiving circuit 210 and the second light receiving circuit 220, the first pitch W1 may be a width extending in the row direction, and the second pitch W2 may be a width extending in the column direction. The first pitch W1 and the second pitch W2 may have the same size (W1=W2) or the first pitch W1 may be larger than the second pitch W2 due to the disposition of the driving circuit 230 in the pixel block 110 (W1>W2). It is illustrated in FIG. 11 that the first pitch W1 is larger than the second pitch W2.

In each of the plurality of pixel blocks 110, each of the first unit pixel 211 to the eighth unit pixel 228 may include a photoelectric conversion element PD which generates photocharges in response to incident light and a transfer transistor TX which transfers the photocharges generated in the photoelectric conversion element PD, to the floating diffusion FD in response to a transfer signal TRF. The floating diffusion FD may temporarily store the photocharges transferred through the transfer transistor TX from the photoelectric conversion element PD. The photoelectric conversion element PD may include a photodiode, a phototransistor, a photogate, a pinned photodiode (PPD) or a combination thereof. In some embodiments of the disclosed technology, the photoelectric conversion element PD may include organic or/and inorganic photodiodes. For example, the photoelectric conversion element PD may include either organic and inorganic photodiodes or may be formed by stacking an organic photodiode and an inorganic photodiode on top of one another. The transfer signal TRF may be generated in a row driver (see the reference numeral 150 of FIG. 15), and may be applied to the transfer transistor TX through a row line (not shown) which extends from the row driver and is coupled to a transfer gate TG. The photoelectric conversion element PD and the floating diffusion FD may serve as the source and the drain, respectively, of the transfer transistor TX.

In each of the plurality of pixel blocks 110, the driving circuit 230 may include a first driving circuit 231 to a third driving circuit 233. The driving circuit 230 may further include pickup regions 248 which are disposed adjacent to the second driving circuit 232. The first driving circuit 231 may initialize the first floating diffusion FD1, the second floating diffusion FD2 and the photoelectric conversion elements PD in response to a reset signal RST. The second driving circuit 232 may generate an output signal Vout corresponding to the photocharges generated in the light receiving circuits 210 and 220 in response to incident light. The third driving circuit 233 may output the output signal Vout, which is generated in the second driving circuit 232, in response to a select signal SEL. In the second direction D2, the third driving circuit 233 may be positioned at the other ends of the light receiving circuits 210 and 220, and the first driving circuit 231 and the second driving circuit 232 may be positioned at one ends of the light receiving circuits 210 and 220. For example, the third driving circuit 233 may be positioned at the lower ends of the light receiving circuits 210 and 220, and the first driving circuit 231 and the second driving circuit 232 may be positioned at the upper ends of the light receiving circuits 210 and 220. The first driving circuit 231 and the second driving circuit 232 may be aligned in the first direction D1. The above-described shape of the driving circuit 230 may provide enough space for the first driving circuit 231 to the third driving circuit 233 to be formed. Further, the shape of the driving circuit 230 may help prevent the interference between the first and second driving circuits 231 and 232 and the third driving circuit 233. Moreover, the shape of the driving circuit 230 may help prevent characteristic degradation due to the presence of the intercoupling circuit 250 which electrically couples the light receiving circuits 210 and 220 to the driving circuit 230. The shape of the driving circuit 230 may provide the intercoupling circuit 250 having a symmetrical shape, and thus it is possible to prevent unwanted variations in the operation characteristics of the plurality of unit pixels.

In each of the plurality of pixel blocks 110, the first driving circuit 231 may initialize the first floating diffusion FD1, the second floating diffusion FD2, and the photoelectric conversion elements PD in response to the reset signal RST. To this end, the first driving circuit 231 may include at least one reset transistor RX. For example, the first driving circuit 231 may include a plurality of reset transistors RX which have a parallel coupling structure. In FIG. 11, it is illustrated that the first driving circuit 231 includes a first reset transistor RX1 and a second reset transistor RX2 coupled in parallel. The first reset transistor RX1 and the second reset transistor RX2 may synchronize with each other in response to the reset signal RST. Therefore, this layout helps increase the channel areas compared to a case where the first driving circuit 231 includes only one reset transistor RX. In particular, the layout including the first reset transistor RX1 and the second reset transistor RX2 coupled in parallel helps increase the channel widths of the reset transistors RX within a limited area. In this way, it is possible to improve the current driving force of the first driving circuit 231 and at the same time improve resistance to noise. In some example embodiments of the disclosed technology, the reset signal RST may be generated in the row driver (see the reference numeral 150 of FIG. 15), and may be applied to the reset transistors RX through row lines (not shown) extending from the row driver and coupled to reset gates RG.

In each of the plurality of pixel blocks 110, the first driving circuit 231 may include first active regions 241, a first reset gate RG1 and a second reset gate RG2, which are formed on the first active regions 241, and first junction regions 243 and second junction regions 244, which are formed in the first active regions 241 at both sides of the first reset gate RG1 and the second reset gate RG2. The first active region 241 for the first reset transistor RX1 and the first active region 241 for the second reset transistor RX2 may be separated from each other. Each of the first active regions 241 may have a bar shape that has a major axis extending in the first direction D1 and a minor axis extending in the second direction D2. While not shown in the drawings, the first reset gate RG1 and the second reset gate RG2 may be electrically coupled to each other. Accordingly, the first reset transistor RX1 and the second reset transistor RX2 may synchronize with each other in response to the reset signal RST. The reset signal RST may be applied to the first reset gate RG1 and the second reset gate RG2. The first junction regions 243 may be the drains of the first reset transistor RX1 and the second reset transistor RX2. The first reset transistor RX1 and the second reset transistor RX2 may be supplied with a reset voltage Vr through the first junction regions 243. The reset voltage Vr may be a positive voltage. For example, the reset voltage Vr may be a power supply voltage (VDD) or a positive voltage larger than the power supply voltage (VDD). The second junction regions 244 may be the sources of the first reset transistor RX1 and the second reset transistor RX2. The second junction regions 244 may be electrically coupled to the intercoupling circuit 250, and the sources of the first reset transistor RX1 and the second reset transistor RX2 may be electrically coupled with the first floating diffusion FD1 and the second floating diffusion FD2 through the intercoupling circuit 250. The second junction regions 244 may be positioned more adjacent to the first floating diffusion FD1 and the second floating diffusion FD2 than the first junction regions 243.

In each of the plurality of pixel blocks 110, the first driving circuit 231 may be positioned at one ends of the light receiving circuits 210 and 220 in the second direction D2. In the first driving circuit 231, the first reset transistor RX1 may be positioned adjacent to the first light receiving circuit 210, and the second reset transistor RX2 may be positioned adjacent to the second light receiving circuit 220. For example, the first reset transistor RX1 may be positioned adjacent to the first unit pixel 211 of the first light receiving circuit 210, and the second reset transistor RX2 may be positioned adjacent to the sixth unit pixel 226 of the second light receiving circuit 220. The first driving circuit 231 may be symmetrical with respect to the boundary where the first light receiving circuit 210 and the second light receiving circuit 220 adjoin each other. In this way, it is possible to prevent variations in the operation characteristics of the plurality of unit pixels. Furthermore, the intercoupling circuit 250 having a symmetrical shape may help prevent unwanted variations in the operation characteristics of the plurality of unit pixels.

In each of the plurality of pixel blocks 110, the second driving circuit 232 may generate the output signal Vout corresponding to the photocharges generated in the light receiving circuits 210 and 220 in response to incident light. To this end, the second driving circuit 232 may include at least one driver transistor DX. For example, the second driving circuit 232 may include a plurality of driver transistors DX which have a parallel coupling structure. In FIG. 11, it is illustrated that the second driving circuit 232 includes a first driver transistor DX1 and a second driver transistor DX2 coupled in parallel, and this layout helps increase the channel areas compared to a case where the second driving circuit 232 includes only one driver transistor DX. In particular, the layout including the first driver transistor DX1 and the second driver transistor DX2 coupled in parallel helps increase the channel widths of the driver transistors DX within a limited area. In this way, it is possible to improve the current driving force of the second driving circuit 232 and at the same time improve resistance to noise.

In each of the plurality of pixel blocks 110, the second driving circuit 232 may be positioned between the first reset transistor RX1 and the second reset transistor RX2. The first driver transistor DX1 and the second driver transistor DX2 may include a second active region 242, and a first drier gate DG1 and a second driver gate DG2 formed on the second active region 242. The first driver gate DG1 and the second driver gate DG2 may be electrically coupled to the first floating diffusion FD1 and the second floating diffusion FD2 through the intercoupling circuit 250. The second active region 242 may have a bar shape that has a major axis extending in the first direction D1 and a minor axis extending in the second direction D2. Third junction regions 245 may be formed in the second active region 242 at one end of the first driver gate DG1 and at the other end of the second driver gate DG2. The third junction regions 245 may be the drains of the first driver transistor DX1 and the second driver transistor DX2. The first driver transistor DX1 and the second driver transistor DX2 may be supplied with a driver voltage Vd through the third junction regions 245. The driver voltage Vd may be a positive voltage. For example, the driver voltage Vd may be the power supply voltage (VDD) or a positive voltage larger than the power supply voltage (VDD). A fourth junction region 246 may be formed in the second active region 242 between the first driver gate DG1 and the second driver gate DG2. The fourth junction region 246 may be the source of the first driver transistor DX1 and the second driver transistor DX2. In the second direction D2, the fourth junction region 246 may be aligned with the boundary where the first light receiving circuit 210 and the second light receiving circuit 220 adjoin each other.

In each of the plurality of pixel blocks 110, the second driving circuit 232 may be positioned at one ends of the light receiving circuits 210 and 220 in the second direction D2, and may be aligned with the first driving circuit 231 in the first direction D1. The first driver transistor DX1 of the second driving circuit 232 may be positioned adjacent to the first light receiving circuit 210, and the second driver transistor DX2 may be positioned adjacent to the second light receiving circuit 220. For example, the first driver transistor DX1 may be positioned adjacent to the second unit pixel 212 of the first light receiving circuit 210, and the second driver transistor DX2 may be positioned adjacent to the fifth unit pixel 225 of the second light receiving circuit 220. The first driver transistor DX1 and the second driver transistor DX2 may be symmetrical to each other with respect to the boundary where the first light receiving circuit 210 and the second light receiving circuit 220 adjoin each other. In this way, it is possible to prevent unwanted variations in the operation characteristics of the plurality of unit pixels from. Furthermore, the intercoupling circuit 250 having a symmetrical shape may help prevent unwanted variations in the operation characteristics of the plurality of unit pixels.

In each of the plurality of pixel blocks 110, the pickup regions 248 provide reference potential for the pixel block 110. In particular, the pickup regions 248 provide reference potential for the driving circuit 230 in the pixel block 110. For example, a ground voltage (VSS) may be supplied to the pixel block 110 through the pickup regions 248. As the reference potential, for example, the ground voltage (VSS) is provided to the pixel block 110 through the pickup regions 248 to improve the operational stability of the pixel block 110. In order to effectively improve the operational stability of the pixel block 110, the pickup regions 248 may be positioned adjacent to the second driving circuit 232. For example, the pickup regions 248 may be positioned adjacent to the drain of the first driver transistor DX1 and the drain of the second driver transistor DX2. In other words, the pickup regions 248 may be formed to be adjacent to the third junction regions 245 which are supplied with the driver voltage Vd. As the pickup regions 248 are disposed adjacent to the third junction regions 245 to which the power supply voltage (VDD) or a positive voltage larger than the power supply voltage (VDD) is applied, it is possible to prevent a variation from occurring in the driver voltage Vd supplied to the third junction regions 245. In this way, it is possible to prevent a variation in the output signal Vout generated in the second driving circuit 232, and the operational stability of the pixel block 110 may be improved. The variation of the driver voltage Vd may occur due to various causes, and may mean that the magnitude or potential of the driver voltage Vd changes. Because the second driving circuit 232 generates the output signal Vout by adjusting the magnitude of the driver voltage Vd to reflect the amount of the photocharges generated in the light receiving circuits 210 and 220, if a variation occurs in the driver voltage Vd, a variation may occur in the output signal Vout as well.

In each of the plurality of pixel blocks 110, the third driving circuit 233 may output the output signal Vout generated in the second driving circuit 232, in response to the select signal SEL. To this end, the third driving section 233 may include at least one selection transistor SX coupled in series to the second driving circuit 232. For example, the third driving circuit 233 may include a plurality of selection transistors SX which have a parallel coupling structure. In FIG. 11, it is illustrated that the third driving circuit 233 is coupled in series to the second driving circuit 232 and includes a first selection transistor SX1 and a second selection transistor SX2 coupled in parallel. The first selection transistor SX1 may output the output signal Vout generated in the second driving circuit 232, to a first output terminal OT1 in response to a first select signal SEL1, and the second selection transistor SX2 may output the output signal Vout generated in the second driving circuit 232, to a second output terminal OT2 in response to a second select signal SEL2. Therefore, the first selection transistor SX1 and the second selection transistor SX2 may output the output signal Vout generated in the second driving circuit 232 alternately to the first output terminal OT1 and the second output terminal OT2. In this way, it is possible to easily increase the channel areas of the selection transistors SX compared to a case where the third driving circuit 233 includes only one selection transistor SX. In particular, the layout discussed above may increase the effective channel widths of the selection transistors SX within a limited area. Further, as the output signal Vout is outputted alternately, the operation speed of the image sensor may be improved. The first select signal SEL1 and the second select signal SEL2 may be generated in the row driver (see the reference numeral 150 of FIG. 15), and may be applied to the selection transistors SX through row lines (not shown) which extend from the row driver and are coupled to selection gates SG.

In each of the plurality of pixel blocks 110, the third driving circuit 233 may include a third active region 261, a first selection gate SG1 and a second selection gate SG2, which are formed on the third active region 261, fifth junction regions 247, which are formed in the third active region 261 at the other side of the first selection gate SG1 and one side of the second selection gate SG2, and a sixth junction region 249, which is formed in the third active region 261 between the first selection gate SG1 and the second selection gate SG2. The third active region 261 may have a bar shape that has a major axis extending in the first direction D1 and a minor axis extending in the second direction D2. The first select signal SEL1 may be applied to the first selection gate SG1, and the second select signal SEL2 may be applied to the second selection gate SG2. The sixth junction region 249 may be the drain of the first selection transistor SX1 and the second selection transistor SX2, and may be coupled to the fourth junction region 246 of the second driving circuit 232 through the intercoupling circuit 250. For example, the drain of the first selection transistor SX1 may be coupled in series to the source of the first driver transistor DX1, and the drain of the second selection transistor SX2 may be coupled in series to the source of the second driver transistor DX2. In the second direction D2, the sixth junction region 249 may be aligned along the boundary where the first light receiving circuit 210 and the second light receiving circuit 220 adjoin each other. The fifth junction regions 247 may be the sources of the first selection transistor SX1 and the second selection transistor SX2, and may be the first output terminal OT1 and the second output terminal OT2 of the third driving circuit 233. The fifth junction regions 247 may be coupled to a column line (not shown), and the output signal Vout may be transferred to the column line through the fifth junction regions 247. The first output terminal OT1 and the second output terminal OT2 of the third driving circuit 233 may be coupled to different column lines.

In each of the plurality of pixel blocks 110, the third driving circuit 233 may be positioned at the other ends of the light receiving circuits 210 and 220 in the second direction D2, and may be positioned at the boundary where the first light receiving circuit 210 and the second light receiving circuit 220 adjoin each other. The first selection transistor SX1 of the third driving circuit 233 may be positioned adjacent to the first light receiving circuit 210, and the second selection transistor SX2 may be positioned adjacent to the second light receiving circuit 220. For example, the first selection transistor SX1 may be positioned adjacent to the fourth unit pixel 214 of the first light receiving circuit 210, and the second selection transistor SX2 may be positioned adjacent to the seventh unit pixel 227 of the second light receiving circuit 220. The drain of the first selection transistor SX1 and the second selection transistor SX2 may be aligned along the boundary where the first light receiving circuit 210 and the second light receiving circuit 220 adjoin each other, in the second direction D2. Thus, the third driving circuit 233 may be is symmetrical with respect to the boundary where the first light receiving circuit 210 and the second light receiving circuit 220 adjoin each other. As the third driving circuit 233 is formed at the other ends of the light receiving circuits 210 and 220 in the second direction D2, it is possible to easily provide a space in which the first driving circuit 231 and the second driving circuit 232 are to be formed. Further, it is possible to prevent characteristic degradation that may be caused due to the shape of the intercoupling circuit 250 which electrically couples the second driving circuit 232 to the third driving circuit 233, and thus it is possible to minimize unwanted variations in the operation characteristics of the plurality of unit pixels that may be caused due to the presence of the intercoupling circuit 250.

In each of the plurality of pixel blocks 110, the intercoupling circuit 250 may include a first intercoupling circuit 250A to a third intercoupling circuit 250C. The first intercoupling circuit 250A may electrically couple the first floating diffusion FD1, the second floating diffusion FD2, the first driver gate DG1 and the second driver gate DG2. The first intercoupling circuit 250A may have a shape that extends from the third intercoupling circuit 250C. The first intercoupling circuit 250A may be symmetrical with respect to the boundary where the first light receiving circuit 210 and the second light receiving circuit 220 adjoin each other. The second intercoupling circuit 250B may electrically couple the source of the first driver transistor DX1 and the source of the second driver transistor DX2 in the second driving circuit 232 to the drain of the first selection transistor SX1 and the drain of the second selection transistor SX2 in the third driving circuit 233. The second intercoupling circuit 250B may be electrically decoupled from the first intercoupling circuit 250A and the third intercoupling circuit 250C, and may overlap with the boundary where the first light receiving circuit 210 and the second light receiving circuit 220 adjoin each other. The third intercoupling circuit 250C may electrically couple the first floating diffusion FD1, the second floating diffusion FD2, the source of the first reset transistor RX1 and the source of the second reset transistor RX2 to each other. The third intercoupling circuit 250C may be symmetrical with respect to the boundary where the first light receiving circuit 210 and the second light receiving circuit 220 adjoin each other. To these ends, the first intercoupling circuit 250A to the third intercoupling circuit 250C may include conductive lines 251 and contacts 252 which couple the conductive lines 251 to the first floating diffusion FD1, the second floating diffusion FD2, the source of the first reset transistor RX1, the source of the second reset transistor RX2, the first driver gate DG1, the second driver gate DG2, the drain of the first selection transistor SX1 and the drain of the second selection transistor SX2. The first intercoupling circuit 250A and the third intercoupling circuit 250C are symmetrical with respect to the boundary where the first light receiving circuit 210 and the second light receiving circuit 220 adjoin each other to maintain the parasitic capacitances existing between the intercoupling circuit 250 and the plurality of unit pixels (e.g., the first unit pixel 211 to the eighth unit pixel 228) at a constant value, thereby allowing each of the plurality of unit pixels to have uniform characteristics. The second intercoupling circuit 250B formed to overlap with the boundary between the first light receiving circuit 210 and the second light receiving circuit 220 may minimize an overlapping area between the second intercoupling circuit 250B and the plurality of unit pixels and thereby minimize influences on the plurality of unit pixels that may result from the second intercoupling circuit 250B.

As described above, in the image sensor implemented based on some embodiments of the disclosed technology, since the second driving circuit 232 is configured by the plurality of driver transistors DX coupled in parallel helps increase the sizes of driver transistors DX (e.g., the channel areas of the driver transistors DX) within a limited area. Further, the second driving circuit 232 having the parallel coupling structure may help increase the effective channel widths of the driver transistors DX, and thus current driving force and resistance to noise may be improved.

Further, in the image sensor discussed above, the layout including the third driving circuit 233 configured by the plurality of selection transistors SX coupled in parallel helps increase the sizes of selection transistors SX (e.g., the channel areas of the selection transistors SX) within a limited area. Further, since the plurality of selection transistors SX may operate alternately, the operation speed of the image sensor may be improved.

Also, since the first driving circuit 231, the second driving circuit 232, the third driving circuit 233, the first intercoupling circuit 250A and the third intercoupling circuit 250C are symmetrical with respect to the boundary where the first light receiving circuit 210 and the second light receiving circuit 220 adjoin each other, the plurality of unit pixels in the pixel block 110 may have uniform operation characteristics.

Figure 13:
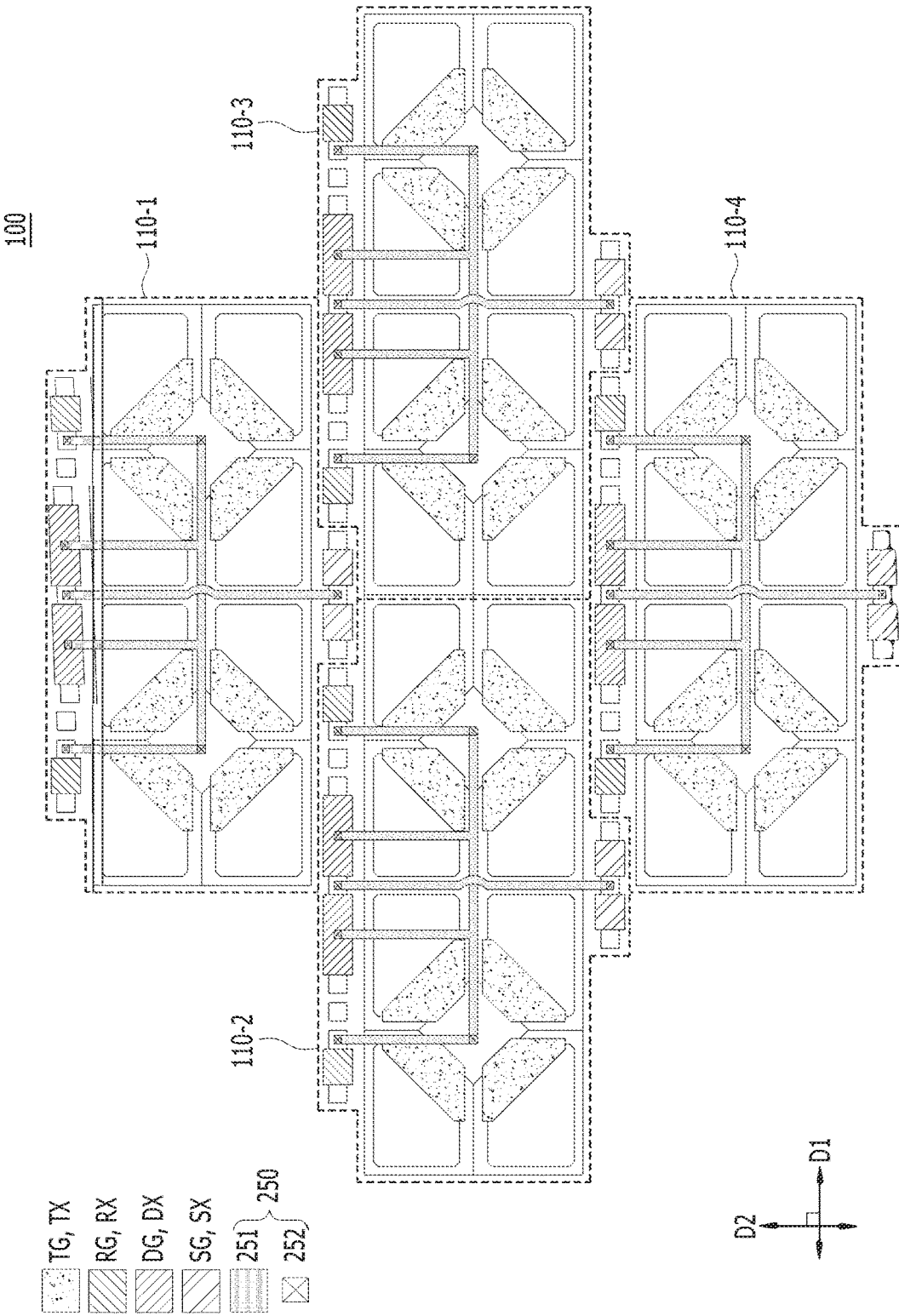
FIG. 13 is a layout illustrating an example of a portion of a pixel array of the image sensor illustrated in FIG. 11.

FIG. 13 is a layout illustrating an example of a portion of a pixel array of the image sensor illustrated in FIG. 11.

As shown in FIGS. 11 and 13, the pixel array 100 implemented based on some embodiments of the disclosed technology may include a plurality of pixel blocks 110 (e.g., 110-1, 110-2, 110-3, 110-4 as shown in FIG. 13) arranged in a zigzag form. For example, a first pixel block 110-1, among the plurality of pixel blocks 110, may be positioned adjacent to a second pixel block 110-2 and a third pixel block 110-3 in the second direction D2. In the second direction D2, the first light receiving circuit 210 of the first pixel block 110-1 may be aligned with the second light receiving circuit 220 of the second pixel block 110-2, and the second light receiving circuit 220 of the first pixel block 110-1 may be aligned with the first light receiving circuit 210 of the third pixel block 110-3. In the first direction D1, the third driving circuit 233 of the first pixel block 110-1 may be positioned between the first driving circuit 231 of the second pixel block 110-2 and the first driving circuit 231 of the third pixel block 110-3. In the first direction D1, the third driving circuit 233 of the first pixel block 110-1, and the first driving circuits 231 and the second driving circuits 232 of the second pixel block 110-2 and the third pixel block 110-3 may be aligned with one another. Further, in the second direction D2, the second pixel block 110-2 and the third pixel block 110-3 may be positioned adjacent to a fourth pixel block 110-4, and the fourth pixel block 110-4 may be aligned with the first pixel block 110-1.

As described above, as the plurality of pixel blocks 110 are disposed in a zigzag form in the pixel array 100, it is possible to dispose the driving circuits 230 of the plurality of pixel blocks 110 in a zigzag manner. In this way, in the plurality of pixel blocks 110, it is possible to suppress characteristic deterioration that may be caused by the interference between adjacent driving circuits 230.

Figure 14:
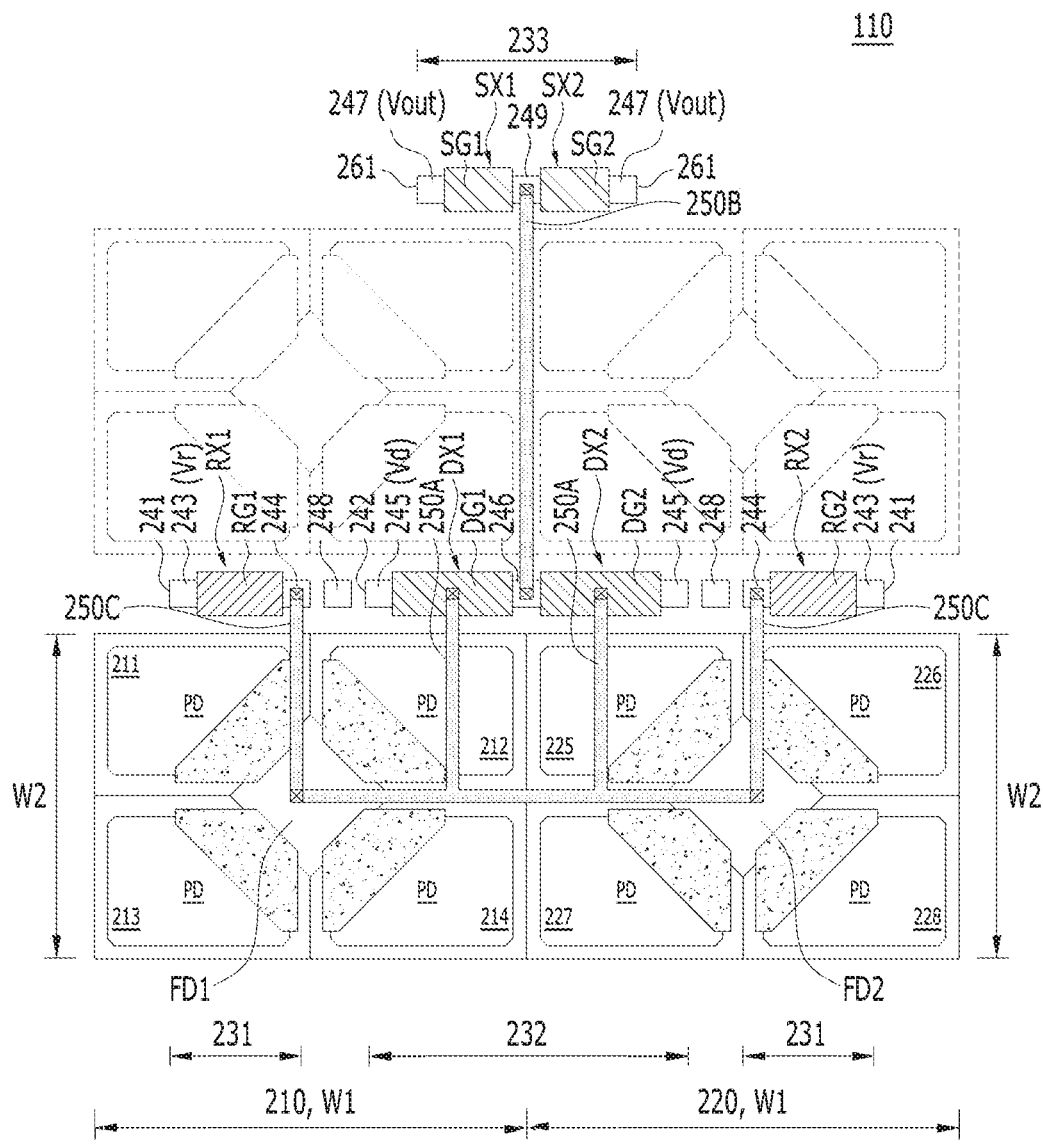
FIG. 14 is a layout illustrating an example of a pixel block of an image sensor based on a modification of the layout illustrated in FIG. 11.

FIG. 14 is a layout illustrating an example of a pixel block of an image sensor based on a modification of the layout illustrated in FIG. 11. Inasmuch as many elements are substantially identical to the elements illustrated in FIGS. 11 to 13, only different features will be described here.

As shown in FIGS. 11 and 14, the image sensor implemented based on some embodiments of the disclosed technology may include the plurality of pixel blocks 110 each including the first driving circuit 231 and the second driving circuit 232 positioned at one ends of the light receiving circuits 210 and 220 of a corresponding pixel block 110 in the second direction D2, and the third driving circuit 233 positioned at the other ends of the light receiving circuits 210 and 220. The image sensor implemented based on a modification of the layout discussed above, however, may include the plurality of pixel blocks 110 each including the first driving circuit 231 and the second driving circuit 232 positioned at one ends of the light receiving circuits 210 and 220 of a corresponding pixel block 110 in the second direction D2, and the third driving circuit 233 positioned at one ends of the light receiving circuits 210 and 220 of other adjacent pixel blocks 110 in the second direction D2. Namely, the third driving circuit 233 may be positioned at one ends of the light receiving circuits 210 and 220 of the corresponding pixel block 110 in the second direction D2, but may be separated by the second pitch W2 of the light receiving circuits 210 and 220 from the first driving circuit 231 and the second driving circuit 232. In this way, the second intercoupling circuit 250B may couple the second driving circuit 232 to the third driving circuit 233, and the interference between the first and second driving circuits 231 and 232 and the third driving circuit 233 may be effectively suppressed. Moreover, since the second intercoupling circuit 250B is formed along the boundary where the first light receiving circuit 210 and the second light receiving circuit 220 adjoin each other, it is possible to prevent unwanted variations in the operation characteristics of the plurality of unit pixels.

Figure 15:
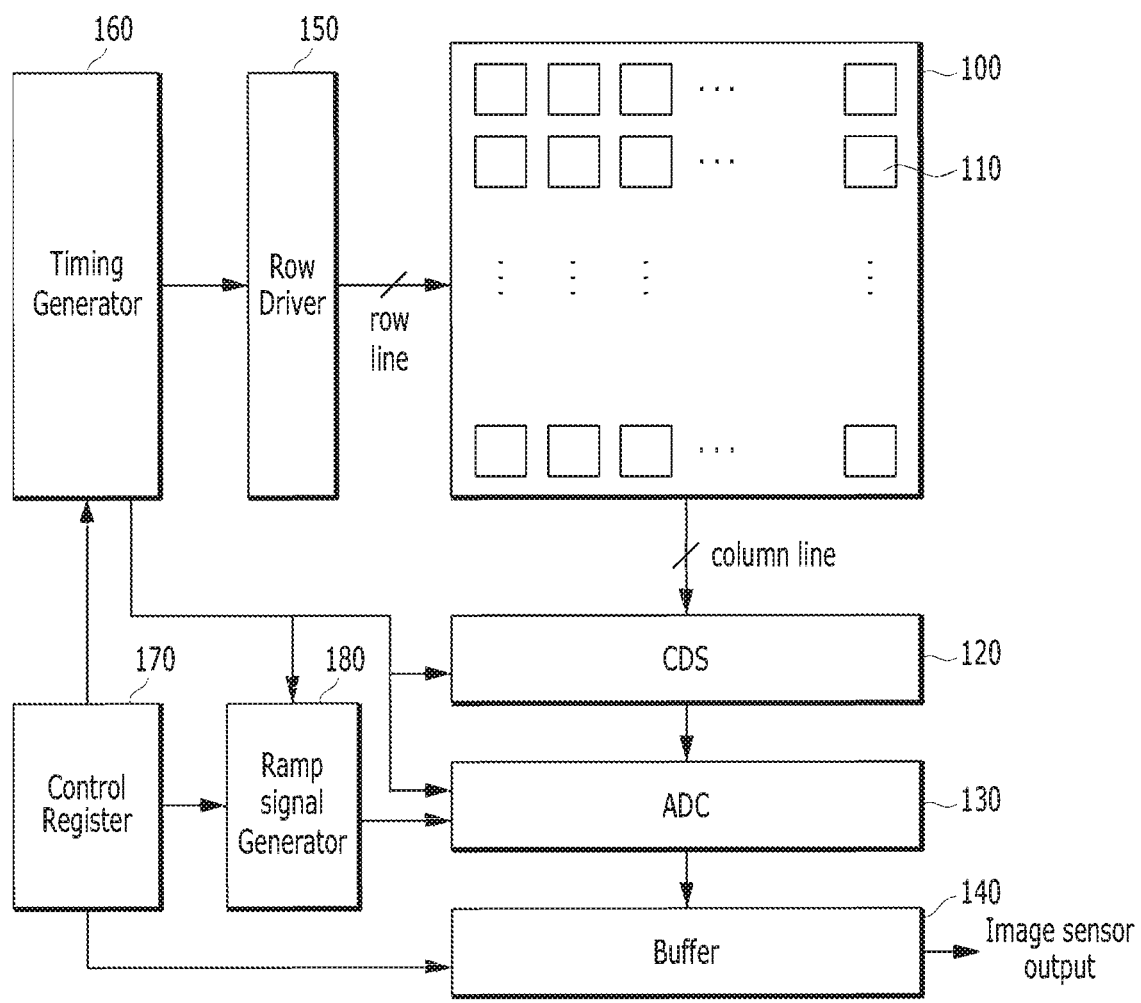
FIG. 15 is a block diagram schematically illustrating an example of an image sensor based on some embodiments of the disclosed technology.

FIG. 15 is a block diagram schematically illustrating an example of an image sensor based on some embodiments of the disclosed technology.

As shown in FIG. 15, the image sensor may include a pixel array 100 in which a plurality of pixel blocks 110 are arranged in a matrix structure, a correlated double sampling (CDS) 120, an analog-digital converter (ADC) 130, a buffer 140, a row driver 150, a timing generator 160, a control register 170, and a ramp signal generator 180.

The timing generator 160 generates one or more control signals for controlling the respective operations of the row driver 150, the correlated double sampling 120, the analog-digital converter 130 and the ramp signal generator 180. The control register 170 generates one or more control signals for controlling the respective operations of the ramp signal generator 180, the timing generator 160 and the buffer 140.

The row driver 150 drives the pixel array 100 by the unit of row line. For example, the row driver 150 may generate a select signal for selecting any one row line among a plurality of row lines. Each of the plurality of row lines is coupled to a plurality of pixel blocks 110. Each of the plurality of pixel blocks 110 is coupled to one row line.

Each of the plurality of pixel blocks 110 senses incident light, and outputs an image reset signal and an image signal to the correlated double sampling 120 through a column line. The correlated double sampling 120 performs sampling for each of the image reset signal and the image signal received therein. Each of a plurality of column lines is coupled to a plurality of pixel blocks 110. Each of the plurality of pixel blocks 110 is coupled to one column line. The analog-digital converter 130 compares a ramp signal, which is outputted from the ramp signal generator 180, and a sampling signal, which is outputted from the correlated double sampling 120, and outputs a comparison signal. The analog-digital converter 130 counts a number of clock signals provided from the timing generator 160 based on a transition time of the comparison signal, and outputs a count value to the buffer 140. The ramp signal generator 180 may operate under control of the timing generator 160.

The buffer 140 stores a plurality of digital signals outputted from the analog-digital converter 130, senses and amplifies the respective digital signals, and outputs resultant signals. Thus, the buffer 140 may include a memory (not shown) and a sense amplifier (not shown). The memory stores count values, and the count values mean the count values associated with the signals outputted from the plurality of pixel blocks 110. The sense amplifier senses and amplifies the respective count values outputted from the memory.

The image sensor discussed above may be used in various electronic devices or systems. For example, the image sensor implemented based on various embodiments of the disclosed technology may be applied to a camera as illustrated in FIG. 16.

Figure 16:
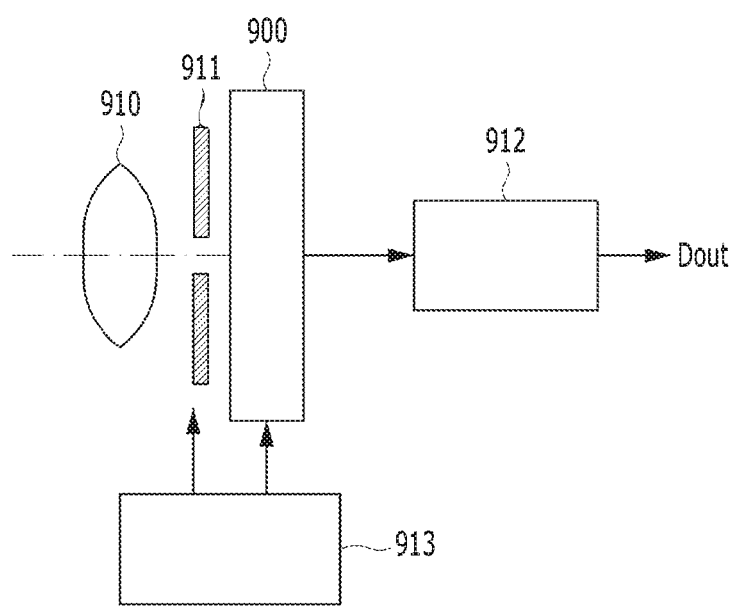
FIG. 16 is a diagram schematically illustrating an example of an electronic device including the image sensor based on some embodiments of the disclosed technology.

FIG. 16 is a diagram schematically illustrating an example of an electronic device including the image sensor based on some embodiments of the disclosed technology.

Referring to FIG. 16, the electronic device including the image sensor implemented based on various embodiments of the disclosed technology may be a camera capable of taking a still image or a moving picture. The electronic device may include an optical system (or optical lens) 910, a shutter unit 911, an image sensor 900, a driving unit 913 for controlling/driving the image sensor 900 and the shutter unit 911, and a signal processing unit 912.

The optical system 910 guides image light (incident light) from an object, to the pixel array of the image sensor 900. The optical system 910 may be constructed by a plurality of optical lenses. The shutter unit 911 controls a light irradiation period and a light shielding period for the image sensor 900. The driving unit 913 controls the transmission operation of the image sensor 900 and the shutter operation of the shutter unit 911. The signal processing unit 912 performs various kinds of signal processing for the signal outputted from the image sensor 900. An image signal Dout after signal processing may be stored in a storage medium such as a memory or be outputted to a monitor or the like.

As is apparent from the above descriptions, in various embodiments of the disclosed technology, since each of at least two of a first driving circuit to a third driving circuit including a plurality of transistors coupled in parallel, it is possible to easily increase the sizes of pixel transistors, in particular, the channel areas of pixel transistors within a limited area. Further, because of the parallel coupling structure, the effective channel widths of the transistors may be increased, and thus current driving force and resistance to noise may be improved.

Moreover, since a driving circuit and an intercoupling circuit are symmetrical with respect to the boundary where a first light receiving circuit and a second light receiving circuit adjoin each other, it is possible to form a plurality of unit pixels in a pixel block to have uniform operation characteristics.

Although various embodiments have been described for illustrative purposes, it will be apparent to those skilled in the art that various changes and modifications may be made without departing from the spirit and scope of the invention as defined in the following claims.

What is claimed is:

1. An image sensor comprising:
a first pixel group including (1) a first light receiving circuit that includes a plurality of unit pixels sharing a first floating diffusion and responsive to incident light to produce photocharges and (2) first and second driving circuits formed adjacent to one end of the first light receiving circuit to generate a first output signal representing the photocharges produced by the first light receiving circuit; and
a second pixel group arranged adjacent to the first pixel group and including (1) a second light receiving circuit that includes a plurality of unit pixels sharing a second floating diffusion and responsive to incident light to produce photocharges and (2) third and fourth driving circuits formed adjacent to one end of the second light receiving circuit to generate a second output signal representing the photocharges produced by the second light receiving circuit,
wherein the first driving circuit is electrically coupled in parallel with respect to the third driving circuit, and the second driving circuit is electrically coupled in parallel with respect to the fourth driving circuit.

2. The image sensor according to claim 1,
wherein the first driving circuit and the third driving circuit comprise a first driver transistor and a second driver transistor, respectively, which generate an output signal corresponding to an amount of photocharges generated in the first light receiving circuit and the second light receiving circuit in response to incident light, and
wherein the second driving circuit and the fourth driving circuit comprise a first selection transistor and a second selection transistor, respectively, which output the output signal to an output line in response to a select signal.

3. The image sensor according to claim 2, wherein the second driving circuit is positioned adjacent to the fourth driving circuit, and the second driving circuit and the fourth driving circuit are positioned between the first driving circuit and the third driving circuit.

4. The image sensor according to claim 2, further comprising:
a fifth driving circuit formed adjacent to the first driving circuit or the third driving circuit, and comprising a reset transistor which initializes the first floating diffusion and the second floating diffusion in response to a reset signal.

5. The image sensor according to claim 2, further comprising:
a fifth driving circuit formed adjacent to the other ends of the first light receiving circuit and the second light receiving circuit, and comprising a reset transistor which initializes the first floating diffusion and the second floating diffusion in response to a reset signal.

6. The image sensor according to claim 5, wherein the fifth driving circuit is positioned adjacent to a boundary where the first pixel group and the second pixel group adjoin each other.

7. The image sensor according to claim 1, wherein:
the first pixel group further comprises a third light receiving circuit which is positioned adjacent to the one end of the first light receiving circuit and includes a plurality of unit pixels sharing a third floating diffusion;
the second pixel group further comprises a fourth light receiving circuit which is positioned adjacent to the one end of the second light receiving circuit and includes a plurality of unit pixels sharing a fourth floating diffusion; and
the first driving circuit and the second driving circuit are positioned between the first light receiving circuit and the third light receiving circuit, and the third driving circuit and the fourth driving circuit are positioned between the second light receiving circuit and the fourth light receiving circuit.

8. The image sensor according to claim 7, wherein
the first driving circuit and the third driving circuit comprise a first driver transistor and a second driver transistor, respectively, which generate an output signal corresponding to an amount of photocharges generated in the first light receiving circuit to the fourth light receiving circuit in response to incident light, and
the second driving circuit and the fourth driving circuit comprise a first selection transistor and a second selection transistor, respectively, which output the output signal to an output line in response to a select signal.

9. The image sensor according to claim 8, wherein the second driving circuit is positioned adjacent to the fourth driving circuit, and the second driving circuit and the fourth driving circuit are positioned between the first driving circuit and the third driving circuit.

10. The image sensor according to claim 8, further comprising:
a fifth driving circuit formed adjacent to the first driving circuit or the third driving circuit, and comprising a reset transistor which initializes the first floating diffusion to the fourth floating diffusion in response to a reset signal.

11. The image sensor according to claim 1,
wherein the first driving circuit and the third driving circuit comprise a first driver transistor and a second driver transistor, respectively, which generate an output signal corresponding to an amount of photocharges generated in the first light receiving circuit and the second light receiving circuit in response to incident light, and
wherein the second driving circuit and the fourth driving circuit comprise a first reset transistor and a second reset transistor, respectively, which initialize the first floating diffusion and the second floating diffusion in response to a reset signal.

12. The image sensor according to claim 11, wherein the first driving circuit is positioned adjacent to the third driving circuit, and the first driving circuit and the third driving circuit are positioned between the second driving circuit and the fourth driving circuit.

13. The image sensor according to claim 11, further comprising:
a fifth driving circuit formed adjacent to the other ends of the first light receiving circuit and the second light receiving circuit, and comprising a selection transistor which output the output signal to an output line in response to a select signal.

14. The image sensor according to claim 13, wherein the fifth driving circuit is positioned adjacent to a boundary where the first pixel group and the second pixel group adjoin each other.

15. The image sensor according to claim 11, further comprising:
a third light receiving circuit having the other end which faces the one end of the first light receiving circuit, and including a plurality of unit pixels sharing a third floating diffusion;
a fourth light receiving circuit having the other end which faces the one end of the second light receiving circuit, and including a plurality of unit pixels sharing a fourth floating diffusion; and
a fifth driving circuit formed adjacent to one ends of the third light receiving circuit and the fourth light receiving circuit, and comprising a selection transistor which output the output signal to an output line in response to a select signal.

16. The image sensor according to claim 11, further comprising:
a fifth driving circuit formed to be adjacent to the other end of the first light receiving circuit, and a sixth driving circuit formed to be adjacent to the other end of the second light receiving circuit,
wherein the fifth driving circuit is coupled in parallel to the sixth driving circuit.

17. The image sensor according to claim 16, wherein the fifth driving circuit and the sixth driving circuit comprise a first selection transistor and a second selection transistor, respectively, which output the output signal to an output line in response to a select signal.

18. The image sensor according to claim 11, further comprising:
a third light receiving circuit having the other end which faces the one end of the first light receiving circuit, and including a plurality of unit pixels sharing a third floating diffusion;
a fourth light receiving circuit having the other end which faces the one end of the second light receiving circuit, and including a plurality of unit pixels sharing a fourth floating diffusion;
a fifth driving circuit formed to be adjacent to one end of the third light receiving circuit; and
a sixth driving circuit formed to be adjacent to one end of the fourth light receiving circuit,
wherein the fifth driving circuit is coupled in parallel to the sixth driving circuit.

19. The image sensor according to claim 18, wherein the fifth driving circuit and the sixth driving circuit comprise a first selection transistor and a second selection transistor, respectively, which output the output signal to an output line in response to a select signal.

20. An image sensor comprising:
at least two light receiving circuits each including a plurality of unit pixels converting light into electrical signals, the plurality of unit pixels of the at least two light receiving circuits sharing a floating diffusion;
a first driving circuit coupling a first power node to floating diffusions, and configured to initialize the floating diffusions in response to a reset signal;
a second driving circuit coupling a second power node to a third driving circuit, and configured to generate an output signal corresponding to an amount of photocharges generated in the light receiving circuits in response to incident light, the second driving circuit comprising a plurality of transistors coupled in parallel; and
a third driving circuit coupling the second driving circuit to an output line, and configured to output, to the output line, the output signal generated in the second driving circuit in response to a select signal,
wherein the first driving circuit or the third driving circuit comprises a plurality of transistors coupled in parallel, or each of the first driving circuit and the third driving circuit comprises a plurality of transistors coupled in parallel.

21. The image sensor according to claim 20, wherein the second driving circuit comprises a first driver transistor and a second driver transistor coupled in parallel, and a gate of the first driver transistor and a gate of the second driver transistor are coupled to the floating diffusions.

22. The image sensor according to claim 20, wherein the first driving circuit comprises a reset transistor, and the third driving circuit comprises a first selection transistor and a second selection transistor coupled in parallel.

23. The image sensor according to claim 22, wherein the first selection transistor and the second selection transistor synchronize with each other in response to a select signal.

24. The image sensor according to claim 22, wherein the first selection transistor and the second selection transistor share the output line.

25. The image sensor according to claim 20, wherein the first driving circuit comprises a first reset transistor and a second reset transistor coupled in parallel, and the third driving circuit comprises a selection transistor.

26. The image sensor according to claim 25, wherein the first reset transistor and the second reset transistor synchronize with each other in response to a reset signal.

27. The image sensor according to claim 20, wherein the first driving circuit comprises a first reset transistor and a second reset transistor coupled in parallel, and the third driving circuit comprises a first selection transistor and a second selection transistor coupled in parallel.

28. The image sensor according to claim 27, wherein the first reset transistor and the second reset transistor synchronize with each other in response to a reset signal.

29. The image sensor according to claim 27, wherein the first selection transistor operates in response to a first select signal, and the second selection transistor operates in response to a second select signal which is different from the first select signal.

30. The image sensor according to claim 27, wherein the first selection transistor and the second selection transistor share the output line, or the first selection transistor and the second selection transistor are coupled to a first output line and a second output line, respectively.

* * * * *